United States Patent [19]
Inoue et al.

[11] Patent Number: 5,873,003
[45] Date of Patent: Feb. 16, 1999

[54] SIGHT LINE DETECTOR, DISPLAY UNIT, VIEW FINDER AND UNIT AND CAMERA WITH THE SAME DISPLAY UNIT

[75] Inventors: Shunsuke Inoue, Yokohama; Mamoru Miyawaki, Isehara; Tetsunobu Kohchi, Hiratsuka; Hidekazu Takahashi, Zama; Takanori Watanabe, Atsugi, all of Japan

[73] Assignee: Canon Kabushiki Kaisha, Tokyo, Japan

[21] Appl. No.: 955,279

[22] Filed: Oct. 21, 1997

Related U.S. Application Data

[63] Continuation of Ser. No. 513,580, Aug. 10, 1995, abandoned, which is a continuation of Ser. No. 175,253, Dec. 28, 1993, abandoned.

[30] Foreign Application Priority Data

| Dec. 28, 1992 | [JP] | Japan | 4-347873 |
| Mar. 26, 1993 | [JP] | Japan | 5-090590 |
| Apr. 8, 1993 | [JP] | Japan | 5-104925 |
| May 21, 1993 | [JP] | Japan | 5-141267 |
| Aug. 31, 1993 | [JP] | Japan | 5-237212 |

[51] Int. Cl.$^6$ .................................................. G03B 17/00
[52] U.S. Cl. .................................................. 396/51
[58] Field of Search ................................ 396/51; 351/200, 351/210, 211

[56] References Cited

U.S. PATENT DOCUMENTS

| 4,496,981 | 1/1985 | Ota | 358/213 |
| 5,036,347 | 7/1991 | Tsunekawa et al. | 354/400 |
| 5,182,443 | 1/1993 | Suda et al. | 354/219 |
| 5,214,466 | 5/1993 | Nagano et al. | 354/62 |
| 5,245,371 | 9/1993 | Nagano et al. | 354/62 |
| 5,253,008 | 10/1993 | Konishi et al. | 354/402 |
| 5,270,748 | 12/1993 | Katz | 351/210 |
| 5,280,312 | 1/1994 | Yamada et al. | 351/200 |
| 5,298,927 | 3/1994 | Konishi et al. | 351/211 |
| 5,327,191 | 7/1994 | Shindo et al. | 354/402 |
| 5,335,035 | 8/1994 | Maeda | 354/219 |
| 5,365,302 | 11/1994 | Koduma | 354/403 |
| 5,386,258 | 1/1995 | Nagano | 354/219 |

FOREIGN PATENT DOCUMENTS

| 0224869 | 6/1987 | European Pat. Off. . |
| 0602895 | 6/1994 | European Pat. Off. . |
| 3841575 | 7/1989 | Germany . |
| 01241511 | 9/1989 | Japan . |

OTHER PUBLICATIONS

Patent Abstracts of Japan, vol. 17, No. 200 (C–1050) 20 Apr. 1993 & JP–A–04 347 127 (Canon Inc) 2 Dec. 1992 *abstract*.

Patent Abstracts of Japan, vol. 17, No. 11 (C–1015) 8 Jan. 1993 & JP–A–04 240438 (Canon Inc) 27 Aug. 1992 *abstract*.

N. Tanaka et al., "A Novel Bipolar Imaging Device with Self–Noise–Reduction Capability", IEEE Transactions on Electron Devices, vol. 36, No. 1, pp. 31–38, Jan. 1989.

Patent Abstracts of Japan, vol. 16, No. 326 (E–1235) & JP–A–04 096 580 (Sony Corp.) Mar. 27, 1992.

Patent Abstracts of Japan, vol. 13, No. 8 (E–702) & JP–A–63 217 880 (Fuji) Sep. 9, 1988.

Primary Examiner—Russell E. Adams
Attorney, Agent, or Firm—Fitzpatrick, Cella, Harper & Scinto

[57] ABSTRACT

There is provided a liquid crystal unit having an on-chip photodetector.

On a transparent substrate are laid down a metallic wiring, an n-type a-Si, an a-SiGe, and a p-type a-Si successively, an insulating film is formed, and then a transparent electrode is formed to have a light detection region.

73 Claims, 28 Drawing Sheets

OR

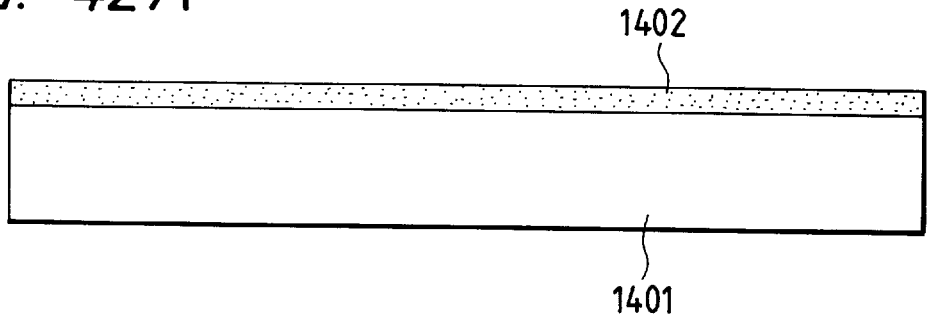
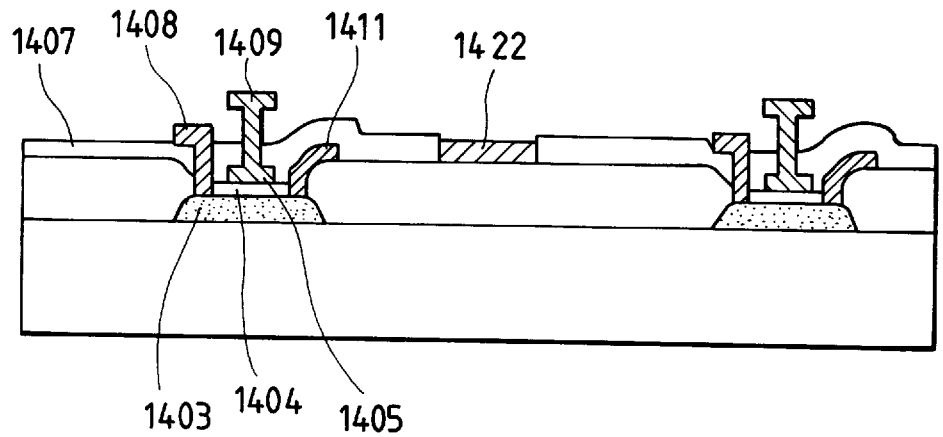
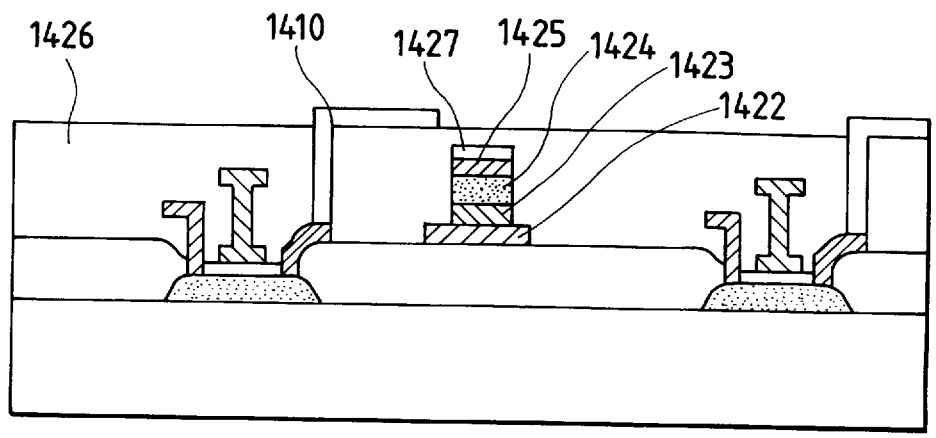

SIGHT LINE DETECTOR, DISPLAY UNIT, VIEW FINDER AND UNIT AND CAMERA WITH THE SAME DISPLAY UNIT

This application is a continuation, of application Ser. No. 08/513,580 filed Aug. 10, 1995, now abandoned, which is a continuation of application Ser. No. 08/175,253 filed Dec. 28, 1993, now abandoned.

BACKGROUND OF THE INVENTION

1. Field of the Invention

The present invention relates to a view point detector, a display unit, a view finder having said display unit and a camera, and more particularly to a sight line detector for detecting the sight line, a liquid crystal display unit for the image display using a liquid crystal material and having means capable of detecting the position on the liquid crystal display unit of the sight line of the observer, a video camera having said display unit, a view finder usable for an electronic camera such as a still video camera, and a camera such as electronic camera.

2. Related Background Art

Conventionally, liquid crystal display units have been employed exclusively for the image display, wherein each display unit is comprised of an image display in a liquid crystal display area 1502 composed of a liquid crystal material and a drive circuit area 1501 having a drive circuit for the image display and provided at least partly around the periphery of the liquid crystal display area, as shown in FIG. 1 which is a typical constitutional view. Liquid crystal display units have been recently utilized for all sorts of electronic apparatuses, including, for example, a display screen for the notebook type computer, a monitor for apparatus, a view finder for videocam coder and so on. In the background, remarkable technical progresses have been made, for example, liquid crystal display units with higher image quality, screens of large size, and mass production technology with reduced costs. However, such progresses only involved the enhancement of display performance, and there was almost no instance of providing additional functions to the liquid crystal display unit.

On the other hand, with the demands from the user side of products, numerous new functions are required for the business equipments and recording apparatuses as mentioned above. In particular, there have been proposed numerous methods of detecting the position at which the user of apparatus (hereinafter referred to as the observer) stares to employ its detection signal for the system control. For example, there is a specific method of using this detection signal as the focusing signal of camera as disclosed in Japanese Patent Publication No. 1-241511.

Referring now to FIG. 2, the outline of a focusing system will be described. FIG. 2 is a typical cross-sectional view showing schematically the constitution of a single lens reflex camera. Light from an object (not shown) is transmitted through an objective lens 701 and reflected at a right angle against a main mirror 702, so that an image is formed on a focusing screen 707 disposed corresponding to a photosensitive member 705 such as a film. The image formed on the focusing screen 707 follows the light path within a pentaprism 708 to pass through an eyepiece 709 to be incident on an observer's eye 715. In FIG. 2, the objective lens at 701 is shown with only a single lens for the sake of convenience, but practically may be comprised of a plurality of lenses as well known. The main mirror at 702 is obliquely disposed in the light path for photographing, or moved out of the light path, depending on the observation (non-photographing) state or the photographing state. A sub-mirror at 703 reflects light flux passing through the main mirror 702 downward toward the bottom of a camera body to be incident on a focus detector 706a. 704a is a shutter, 704b is a diaphragm disposed within the objective lens 701, and 704c is a drive mechanism for moving the objective lens 701 to effect focusing in a light axial direction. 705 is a photosensitive member, for example, a film of silver salt, a solid-state image pickup device using CCD or MOS-type transistor, or an image pickup tube such as a vidicon. 706a is a focus detector capable of detecting the focal point at a plurality of positions on the sight line for photographing. 706b is an exposure value detecting unit comprising an image forming lens and a light receiver allowing for the separate metering. The image forming lens relates conjugately the focusing screen 707 disposed on a predefined image forming plane for the objective lens 1 to the light receiver via the light path within the pentaprism 708. The output of the light receiver is sent to a microprocessor mp which can change the weighting to have a photometry sensitivity distribution around a plurality of central points.

Rearward of an exit plane of the pentaprism 708 for changing the finder light path, an eyepiece 709 is disposed, and used for the observation of the focusing screen with the observer's eye 715. 710 is a beam splitter, using a dichroic mirror for reflecting infrared ray, for example, which is provided within the eyepiece 709. 711 is a condenser lens, 712 is a beam splitter such as a half-mirror, 713 is an illuminating light source such as an LED, which preferably emits the infrared (and near infrared) ray. A light flux emerging from the illuminating infrared light source 713 is passed along the finder light path as parallel light, for example, by virtue of the power of the condenser lens 711 and the back face of the eyepiece 709 (the lateral side of the observer). 714 is a photoelectric converter which is disposed relative to the back face of the eyepiece 709 and the condenser lens 711 to be conjugate to the front eye part of the observer's eye, or particularly the neighborhood of a pupil, when the observer peeps through the eyepiece 709 properly. That is, one method is to dispose the appoint neighborhood of a finder optical system (708, 709) and the photoelectric converter 714 conjugately, preferably with the imaging power of 1 or less.

With the above constitution, an imaging light flux passing through the objective lens 701 is partially transmitted through the main mirror 702 and thus divided into a finder light flux and a focus detecting light flux. The focus detecting light flux is transmitted through the main mirror 702, and then reflected against the sub-mirror 703 to be incident on the focus detector 706a. In photographing, the main mirror 702 is turned upward, and the sub-mirror 703 is folded up over the main mirror. And the film 705 is exposed to light for a predetermined time while a shutter vane 704a is opened and then closed.

On the other hand, the finder light flux passes through the focusing screen 707 and enters the pentaprism 708. Herein, a Fresnel lens integral with or separate from the focusing screen may be disposed near the pentaprism 708. The light flux is incident on the eye of the observer 715 who views an object image projected on the focusing screen 707 by enlarging it by virtue of the dioptric-correction eyepiece 709.

The light path of a sight line detection system is as follows. An illuminating light emitting from the illuminating infrared light source 713 is transmitted through the half-mirror 712, collimated to some degree, and reflected from the mirror 710 to travel along the finder light path. It is desirable from the respects of finder brightness and illumination efficiency of the sight line detection system that the beam splitter 710 can transmit the finder light in visible range coming from the object, and the dichroic mirror can reflect illuminating light in infrared range. However, it is possible to substitute an ND half-mirror by considering on design that if using an infrared light source having too high luminance, the illumination efficiency decreases. Illuminating infrared light introduced into the finder light path passes through the back face of the eyepiece 709 to illuminate the observer's eyeball. Herein, it is expedient to make the illuminating light a substantially parallel light flux in entering the eyeball, so that the illumination condition can be unchanged if the position of observer's eye varies. This can be implemented by adjusting the power arrangement of each portion by utilizing the power of the lens 711 placed ahead and the power of the back face of the eyepiece 709 together.

Reflected light from the observer, which follows the reverse path, is transmitted through the mirror 710 and the lens 711, and reflected from the half-mirror 712 to enter the photoelectric converter 714. Herein, it is desirable that an infrared transmission filter for cutting off the visible light is inserted in the light path from the site where reflected light is separated from the finder light path to the site where it is received by the photoelectric converter. This is intended to cut off visible light of finder image reflected from the cornea to convert photoelectrically only reflected infrared light which is meaningful as the light signal. A photoelectric plane is placed at a site where the neighborhood of a crystal lens or pupil of the observer's eye is imaged with the total power of the lens 711 and the back face of the eyepiece 709. Thereby, light acceptance is performed in the state where Purkinje's first, second, and fourth images are formed, whereby the amount of reflected light is not necessarily weak. The third image does not greatly contribute to the photoelectric conversion signal because it is defocused and light is diffused.

In order to implement the above system when the liquid crystal display unit is used as the image display, it is important to incorporate a sight line detection function, without increasing the number of components as well as the total size of unit, by accumulating photoelectric conversion devices in a portion of the liquid crystal display unit.

However, the conventional active-type liquid crystal display unit used TFTs for the driving of liquid crystal, but conventionally, TFT is composed of polysilicone, amorphous silicone, or single crystal silicone, with its film thickness being about several hundreds Å to 1 µm. On the other hand, to make efficient photoelectric conversion of infrared ray, it is necessary to have the thickness of about several µm for polysilicone and amorphous silicone, and for single crystal silicone, the thickness of 5 µm at minimum. Because the light used for the sight line detection was an extremely weak signal, the integration of a liquid crystal display and a photoelectric converter was virtually impossible.

That is, it was difficult that both an image display area capable of transmitting visible light to operate TFTs (Thin Film Transistor) and a photoelectric conversion area capable of making photoelectric conversion for the sight-line detection by absorbing light enough were provided on the same substrate, and fabricated in a manufacturing process as simple as possible, as long as conventional liquid crystal displays were used.

Next, one example of the sight line detection method will be described below with reference to FIGS. 3 and 4.

FIG. 3 is a principle view of the sight line detection method.

In the figure, 204 is a light source such as a light emitting diode for emitting infrared ray insensitive to the object, which is disposed on the focal plane of a projection lens 206.

Infrared ray emitted from the light source 204 is made a parallel light by the projection lens 206, and reflected against the half-mirror 205 to illuminate a cornea 201 of an eye ball 200. At this time, a Purkinje image d based on a part of infrared ray reflected from the surface of the cornea 201 is transmitted through the half-mirror 205 and converged by a light receiving lens 207 so that the Purkinje image d is formed again at a position d' on an image sensor 209. Also, a light flux from the ends a, b of an iris 203 is introduced via the half-mirror 205 and the light receiving lens 207 onto the image sensor 209, where an image on the ends a, b is formed at the positions a', b'.

When the rotational angle θ of the eye ball's optical axis with respect to the optical axis of the light receiving lens 207 is small, the coordinate Zc of the central position c of the iris 203 can be expressed as:

$$Zc \simeq (Za+Zb)/2$$

where Za and Zb are Z coordinates of the ends a, b of the iris 203, respectively. Supposing that the Z coordinate of the position d where Purkinje image occurs is Zd, and the distance from the center of curvature o for the cornea 201 to the center of the iris 203 is Loc, the rotational angle θ of the eye ball's optical axis can substantially satisfy the relation:

$$Loc \cdot \sin \theta \simeq Zc - Zd \qquad (1)$$

Therefore, the rotational angle θ of the eyeball's optical axis can be obtained by detecting the position of each feature point (each of images Za', Zb', Zd' on the image sensor 209 projected from the occurrence position d of Purkinje image and the ends a, b of the iris 203). Then, the above expression (1) can be rewritten as:

$$\beta Loc \cdot \sin \theta = (Za'-Zb')/2 - Zd' \qquad (2)$$

Where β is a magnifying power as determined by the distance $L_1$ between the occurrence position d of Purkinje image and the light receiving lens 207 and the distance $L_0$ between the light receiving lens 207 and the image sensor 209, which is normally a substantially constant value.

In this manner, by detecting the sight line (gazing point) of the observer's eyeball 200, it is possible to know at which point the photographer is staring on the focusing screen in the single lens reflex camera or video camera, for example.

In the above example, the detection of Purkinje image often becomes difficult because another peak output value appears at a position other than Purkinje image due to leak light from the external into the finder or reflection of illuminating infrared ray against the eyelashes.

The above phenomenon will be described below with reference to FIGS. 4A and 4B.

FIG. 4A is an output of the image sensor 209 without leak light such as external light, where d is Purkinje image, a, b is the boundary between the pupil and the iris 203, and i, h is the boundary between the iris 203 and the sclera 202.

If the external light is imaged on the image sensor 209, the output state is as shown in FIG. 4B, with a peak arising at the position f. Accordingly, this peak can not be distinguished from original Purkinje image, so that the sight line detection often fails.

SUMMARY OF THE INVENTION

An object of the present invention is to provide a display unit having a photoelectric converter excellent in the photoelectric conversion efficiency, and provide a view finder and an electronic camera, capable of containing a display feature and a sight line detection feature with a good space efficiency.

Also, it is another object of the invention to provide a view finder and an electronic camera wherein the user does not feel very fatigued in the long term use since the focusing for the display can be made in accordance with the sight line in using the view finder.

Further, it is another object of the invention to provide an electronic camera capable of surely photographing the scene as desired by focusing, and effecting quite excellent recording.

Also, it is another object of the invention to provide a liquid crystal display unit which can be constructed in smaller size by unifying a photoelectric converter into the liquid crystal display unit, and additionally provide a view finder and an electronic camera of smaller size and with higher performance.

It is another object of the invention to provide a sight line detector capable of detecting properly the sight line at all times, even under the service environment where light other than illuminating light is incident from illuminating means.

Also, it is another object of the present invention to provide a liquid crystal display unit having a pair of substrates and a liquid crystal material sealed between said pair of substrates, characterized by comprising semiconductor elements for driving said liquid crystal display unit, and photoelectric conversion elements disposed apart from said semiconductor elements, a view finder having said liquid crystal display unit, and a camera having said view finder.

In addition, it is another object of the invention to provide a sight line detector having a plurality of light receiving means for receiving reflected light from the eyeball of the object (observer) which is illuminated from illuminating means illuminating the eyeball, and calculating means for calculating the sight line direction of the object (observer) based on the output signals from said plurality of light receiving means, wherein by taking a logical product of output signals from said plurality of light receiving means, for example, and separating between an original Purkinje image output and a pseudo peak output, the sight line direction of the object (observer) is calculated from a Purkinje image obtained.

Also, it is another object of the invention to provide a display unit having illuminating means for illuminating the observer's eye, a light converging optical system for converging the reflected light from the observer's eye, photoelectric conversion means for detecting reflected light converged, and calculating means for calculating the sight line direction of the observer's eye with the output of said photoelectric conversion means, characterized that said photoelectric conversion means and said image display means are disposed adjacent each other, and said photoelectric conversion means is driven using at least a part of driving means for driving said image display means.

BRIEF DESCRIPTION OF THE DRAWINGS

FIGS. 42A to 42C are views showing the manufacturing process in the embodiment 22 of the present invention.

DETAILED DESCRIPTION OF THE PREFERRED EMBODIMENTS

The present invention will be described in detail in connection with the embodiments as shown in the accompanying drawings.

(Embodiment 1)

Figure 1:
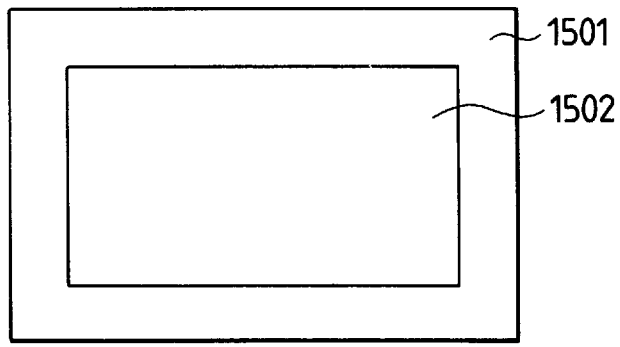
FIG. 1 is a typical constitutional view for explaining an example of conventional liquid crystal display unit.
Figure 2:
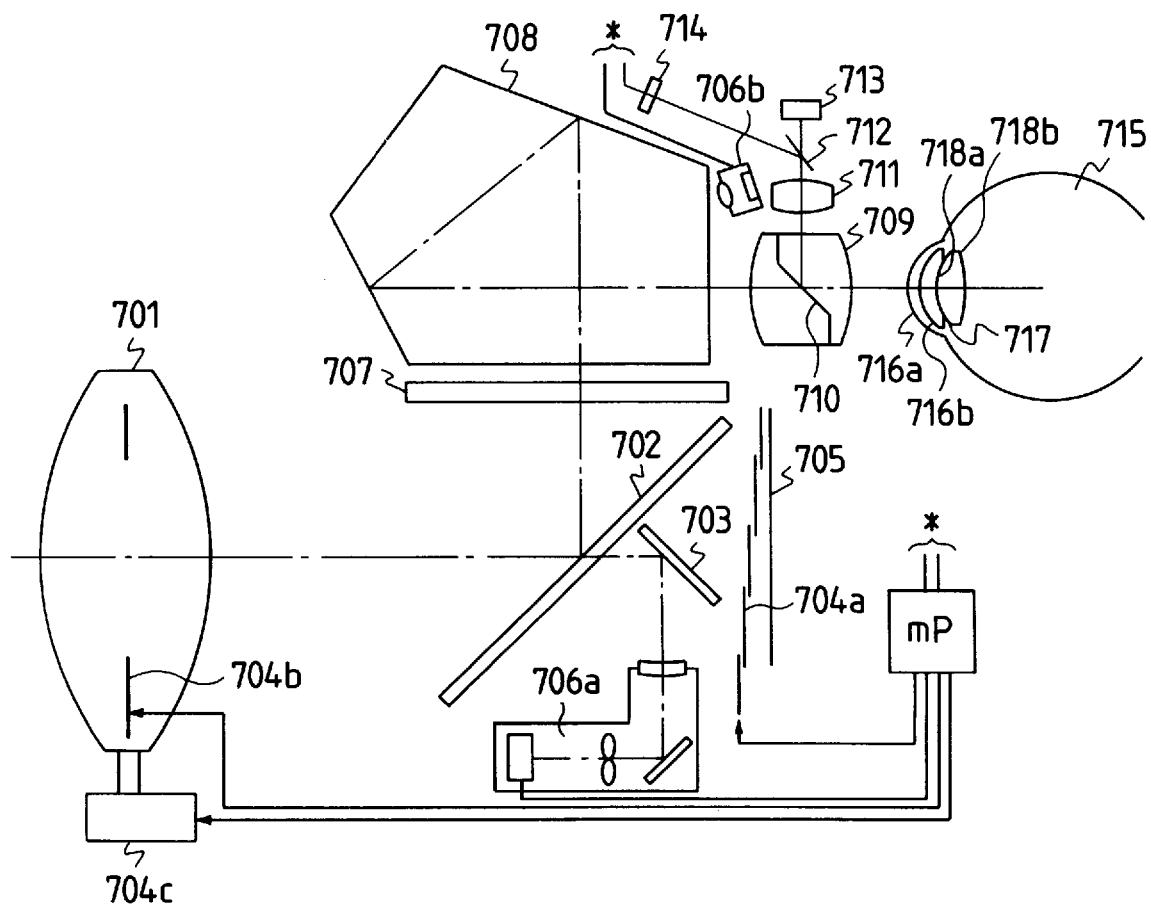
FIG. 2 and FIG. 3 are typical cross-sectional views for explaining an example of the constitution for the sight line detection.
Figure 3:
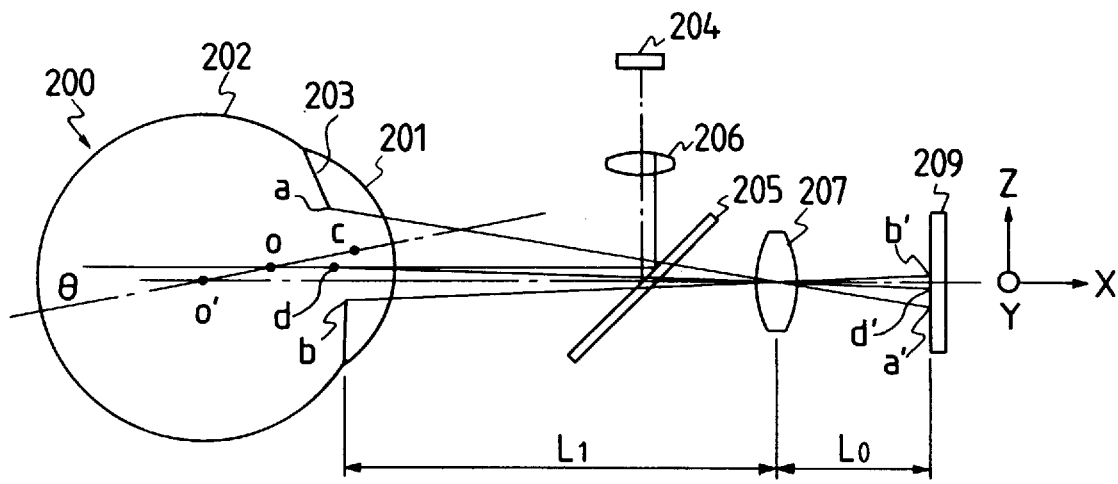
Figure 4A:
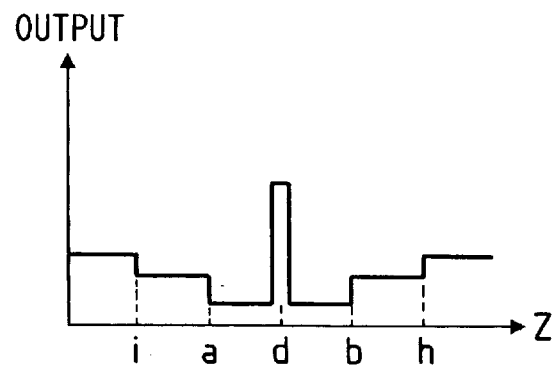
FIGS. 4A and 4B are graphic representations showing the output state of an image sensor as shown in FIG. 3 when the external light is not incident and incident, respectively.
Figure 4B:
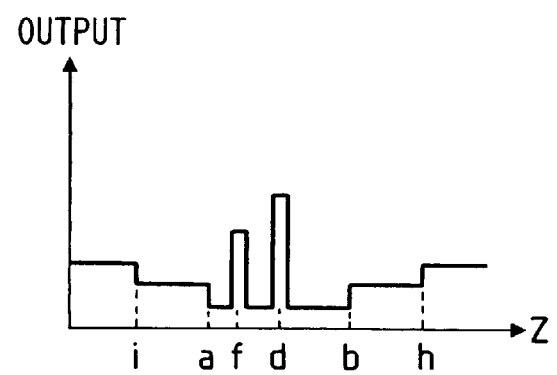
Figure 5:
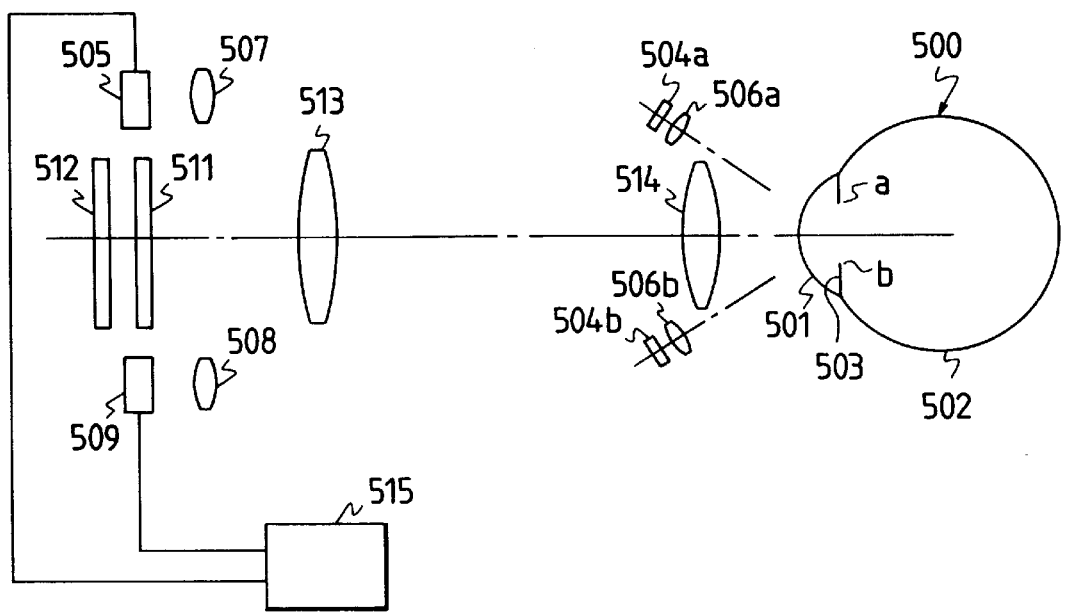
FIG. 5 is a view showing the essential constitution of a sight line detector according to the first embodiment of the present invention.

FIG. 5 is a view showing the essential constitution of a sight line detector according to the first embodiment of the present invention, wherein the present invention has been achieved for the detection of the sight line of the observer with a finder in a video camera.

In FIG. 5, 500 is an eye ball of the object, 501 is a cornea of the eye ball of the object, 502 is a sclera, and 503 is an iris. 504a, 504b are light sources, respectively, which are light emitting diodes for emitting infrared ray insensitive to the object. 506a, 506b are projection lenses, respectively, which illuminate the surface of the cornea 501 with light flux from the light sources 504, 504b. Note that a light source 504a and a projection lens 506a constitute a first illuminating means and a light source 504b and a projection lens 506b constitute a second illuminating means.

507, 508 are light receiving lenses, respectively, through which an image at the end points a, b of the iris is formed on the plane of the image sensors 505, 509. Note that a light receiving lens 7 and an image sensor 505 constitute a first light receiving means and a light receiving lens 508 and an image sensor 509 constitute a second light receiving means.

511 is a liquid crystal panel, and 512 is a back light illuminating the liquid crystal panel 511 from the back side thereof, which constitute a liquid crystal finder for an image display unit, whereby an image displayed on the liquid crystal panel 11 is formed through an objective lens 513 and an eyepiece 514 on the cornea of the eyeball 500 of the object.

515 is calculation means for calculating the sight line of the object, using output signals from the image sensors 505, 509.

Figure 6A:
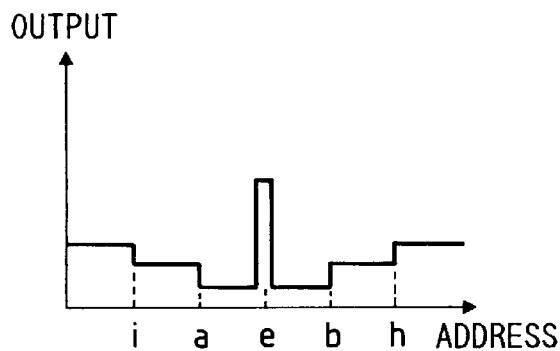
FIGS. 6A and 6B are graphic representations showing the output state of each image sensor as shown in FIG. 5 when the external light is not incident.
Figure 6B:
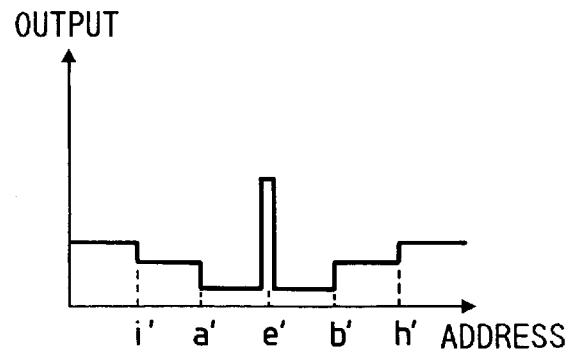

FIGS. 6A and 6B show the output signals from the image sensors 505, 509 in the ideal state without external light entering.

Herein, the signal is considered to be an output from a one-dimensional line sensor for the sake of simplicity, but it will be appreciated that the same thing can be applied to a two-dimensional area sensor.

In FIGS. 6A and 6B, e is a peak output of Purkinje image with the first illuminating means from the image sensor 5, and e' is a peak output of Purkinje image with the second illuminating means from the image sensor 9.

Herein, one illuminating means is used for each of the image sensors 505, 509, but it is naturally possible that two or more illuminating means can be also used.

Figure 7A:
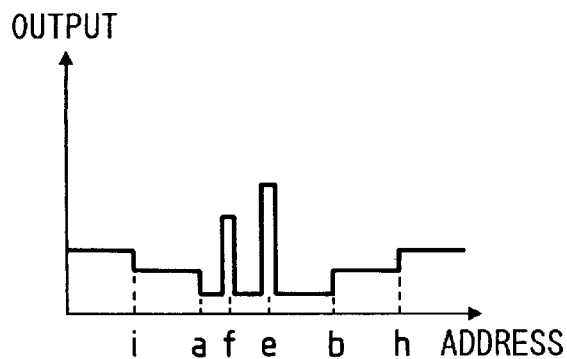
FIGS. 7A and 7B are graphic representations showing the output state of each image sensor as shown in FIG. 5 when the external light is incident.
Figure 7B:
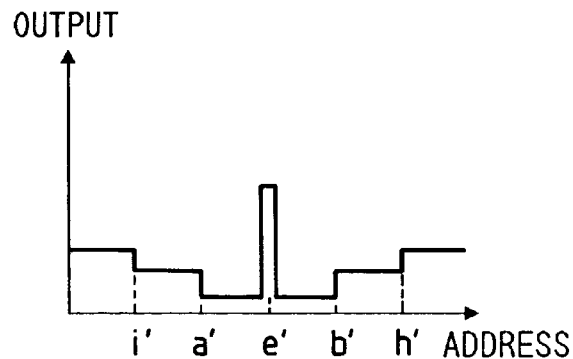

FIGS. 7A and 7B show the output signals when the external light such as solar rays enters the finder.

Herein, it is supposed that when the external light is incident, an image is formed through the light receiving lens 507 on the image sensor 505. Due to this external light, a peak output appears at the position f.

In this way, a pseudo peak signal is output from the image sensor 505, but because the optical axis of the first light receiving means is not coincident with that of the second light receiving means, the external light is less likely to enter the image sensor 509, so that no pseudo peak signal is output from the image sensor 509.

Therefore, the output from the image sensor 505 and the output from the image sensor 509 are transferred into the calculation means 515 to make a determination whether or not the output from the image sensor is normal without having multiple peak outputs, so that the sight line of the observer can be detected by performing operations in accordance with the above expressions (1) and (2), and the correction calculation for the visual line.

Also, the correct position of Purkinje image can be detected by making a logical calculation for the positions of the peak outputs from the image sensor 505 and the image sensor 509.

As the logical calculation for the detection, two operations are available:

1) Logical product
2) Exclusive OR

These operations will be described below.

1) "Logical product"

Purkinje image with the first illuminating means is formed on the image sensor 505, and Purkinje image with the second illuminating means is formed on the image sensor 509. The address of Purkinje image detected by the image sensor 505 is A1, and the addresses detected by the image sensor 509 are B1, B2. Herein, B1 is the address of Purkinje image and B2 is the address with the external light.

If the optical system is designed such that Purkinje image is formed at the same positions on the image sensor 505 and the image sensor 509, it follows that address A1 is equal to address B1. Herein, by taking a logical product between the output of the image sensor 505 and the output of the image sensor 509, the correct peak position of Purkinje image can be detected by removing the address B2 (peak with the external light).

Also, if Purkinje image is not formed at the same positions on the image sensors 505, 509, the same effect can be obtained by subtracting the offset amount of position and calculating the logical product.

2) "Exclusive OR"

An optical arrangement is adopted in which Purkinje image with the first illuminating means is formed on the image sensor 505, and Purkinje image is not formed on the second image sensor 509. That is, since the image sensor 509 has the image formed only by the external light, a correct Purkinje image can be detected in the output from the image sensor 505 by calculating the exclusive OR of the outputs of the image sensors.

As described in this embodiment, the sight line detection can be effected without influence from the external light by using a plurality of image sensors for the sight line detection sensor, and making a comparison between the outputs.

While in this embodiment a liquid crystal finder is used for the image display unit, it will be appreciated that this embodiment is naturally applicable to an image display unit using a Braun tube. Also, while two illuminating light sources are used, it will be appreciated that three or more light sources can be naturally used, or conversely only one light source may be used if the optical system is designed.

(Embodiment 2)

Figure 8:
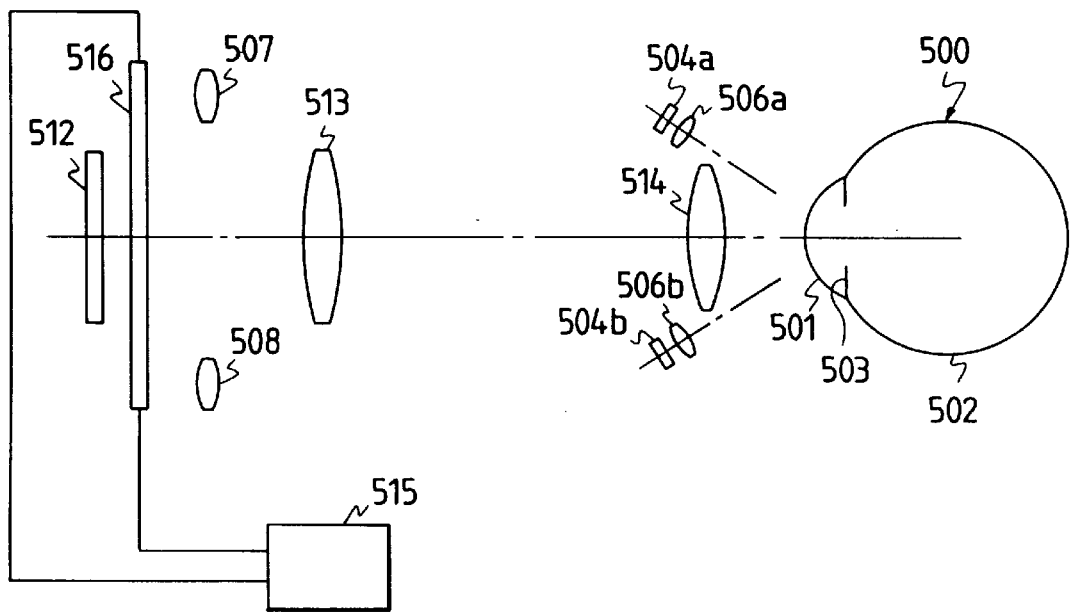
FIG. 8 is a view showing the essential constitution of a sight line detector according to the second embodiment of the present invention.

FIG. 8 is view showing the essential constitution of a sight line detector according to the second embodiment of the present invention, wherein the like reference numerals are attached to the same parts as used in FIG. 5.

In FIG. 8, 516 is an image display unit having image sensors around the periphery thereof.

Figure 9:
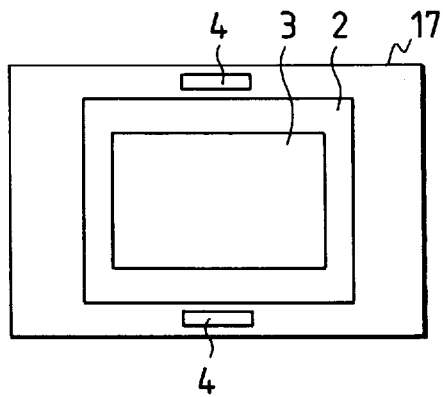
FIGS. 9, 10 and 11 are views showing the constitution of an image display unit having a photoelectric converter.

FIG. 9 is a schematic plan view showing the image display unit 516.

In FIG. 9, 17 is an SOI substrate, 3 is a liquid crystal panel (liquid crystal display area), 2 is a liquid crystal drive circuit, and 4 is an image sensor.

In the previous first embodiment, at least two chips for image sensors and one chip for liquid crystal panel are required as the semiconductor element, whereas in this second embodiment, there are provided an image sensor 4 and a liquid crystal panel 3 within the same chip, resulting in the feature of less components and smaller size.

Since the image sensor 4 is smaller as compared with the liquid crystal panel 3, it can be constitute of one chip without significant increase in the area and with favorable costs. For example, in this embodiment, the liquid crystal panel 3 has a size of 25×27 mm, while the image sensor is sufficient with a size of 2×3 mm.

Figure 10:
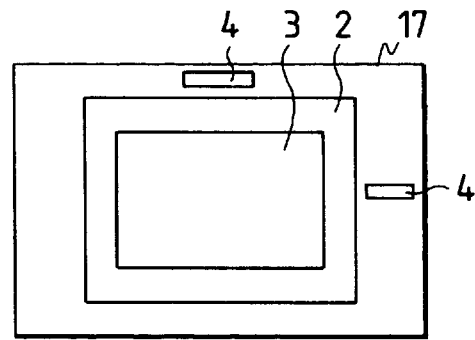

Also, the image sensor 4 may be provided at the positions as shown in FIG. 10.

In this second embodiment, the liquid crystal panel 3 and a plurality of image sensors 4 are constituted of one chip, whereby the apparatus can be made smaller and the costs reduced.

(Embodiment 3)

Figure 11:
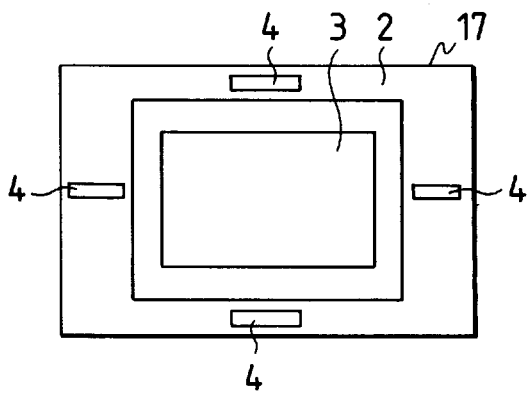

FIG. 11 is a view showing the constitution of an image display unit comprising image sensors according to the third embodiment of the present invention, wherein like reference numerals are attached to the same parts as used in FIG. 9. Note that the other constitution is identical to that of the embodiment 2, and is not described any more.

While in the above embodiment 2, the image sensors 4 are provided at two positions on the upper and lower sides of the liquid crystal display panel (liquid crystal display area), it is seen in this embodiment that image sensors 4 are further provided on the right and left sides of the liquid crystal panel. Also, it will be understood that the number of image sensors is not limited to two, but may be greater than two.

In this embodiment, four image sensors 4 are provided on the upper and lower, right and left sides of the liquid crystal display panel (liquid crystal display area), whereby the higher precision detection of the sight line can be effected.

(Embodiment 4)

Figure 12:
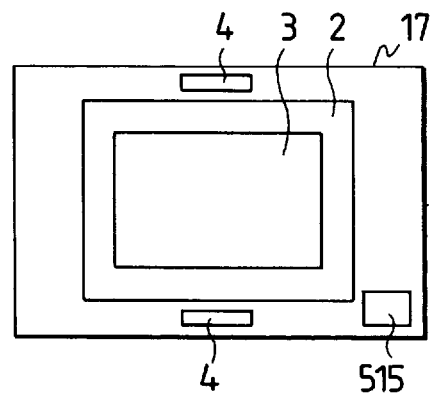
FIG. 12 is a view showing the constitution of an image display unit including a photoelectric converter (image sensor) and calculation means according to the present invention.

FIG. 12 is a view showing the constitution of an image display unit comprising the image sensors according to the fourth embodiment of the present invention, wherein like reference numerals are attached to the same parts as used in FIG. 9.

In this embodiment, an image display unit a sight line detecting image sensor, and calculating means 151 are constituted of one chip. Note that the other constitution is identical to that of the embodiment 2, and is not described any more.

Herein, calculating means 14 is a microprocessor, for example, which executes the address correction, the logical operation (logical product, exclusive OR), and the above expressions (1) and (2).

With this constitution, the apparatus can be made still smaller and the costs reduced.

(Embodiment 5)

Figure 13:
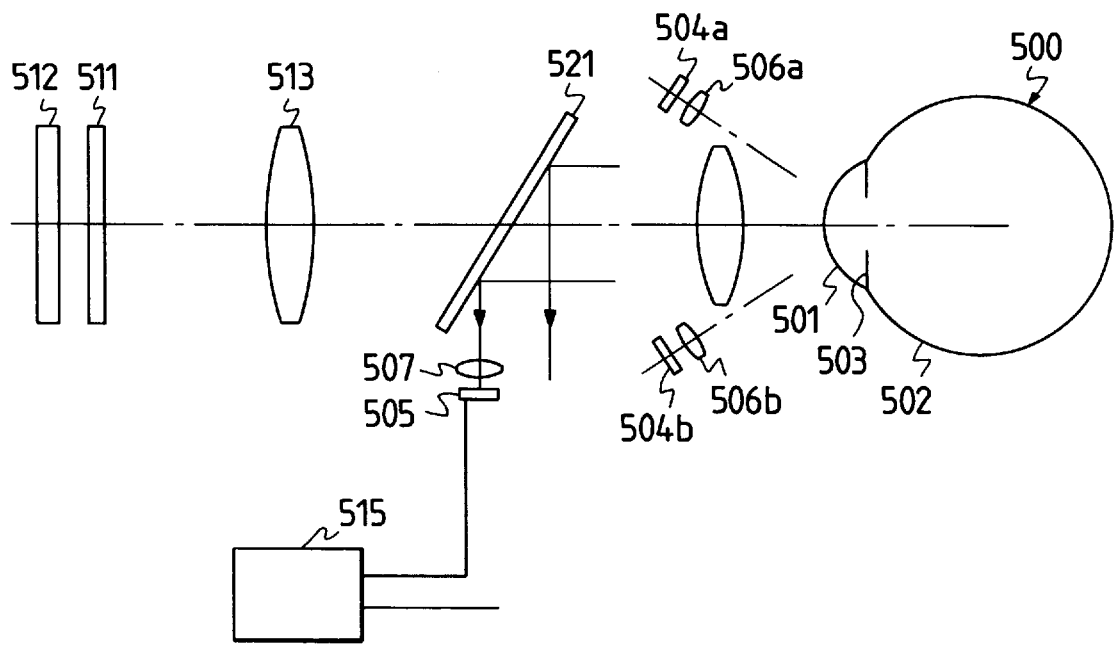
FIG. 13 is a view showing the essential constitution of a sight line detector according to another embodiment of the present invention.

FIG. 13 is a view showing the essential constitution of a sight line detector according to the fifth embodiment of the present invention, wherein like reference numerals are attached to the same parts as used in FIG. 5.

In FIG. 13, 521 is a dichroic mirror for reflecting infrared ray.

Infrared ray emitted from the light sources 504a, 504b is made a parallel light through projection lens 506a, 506b to illuminate the eyeball 500. Infrared ray reflected from the eyeball 500 is reflected against the dichroic mirror 521 and transmitted through a light receiving lens 507 to form an image on an image sensor 505. Likewise, an image is formed through the light receiving lens 507 on an image sensor 509.

Calculation means 515 accepts the outputs from the above image sensors 505, 509 and performs the same calculation as in the embodiment 1 to make the sight line detection of the observer.

This embodiment is effective when image sensors 505, 509 can not be provided around the periphery of the image display unit.

(Embodiment 6)

Figure 14:
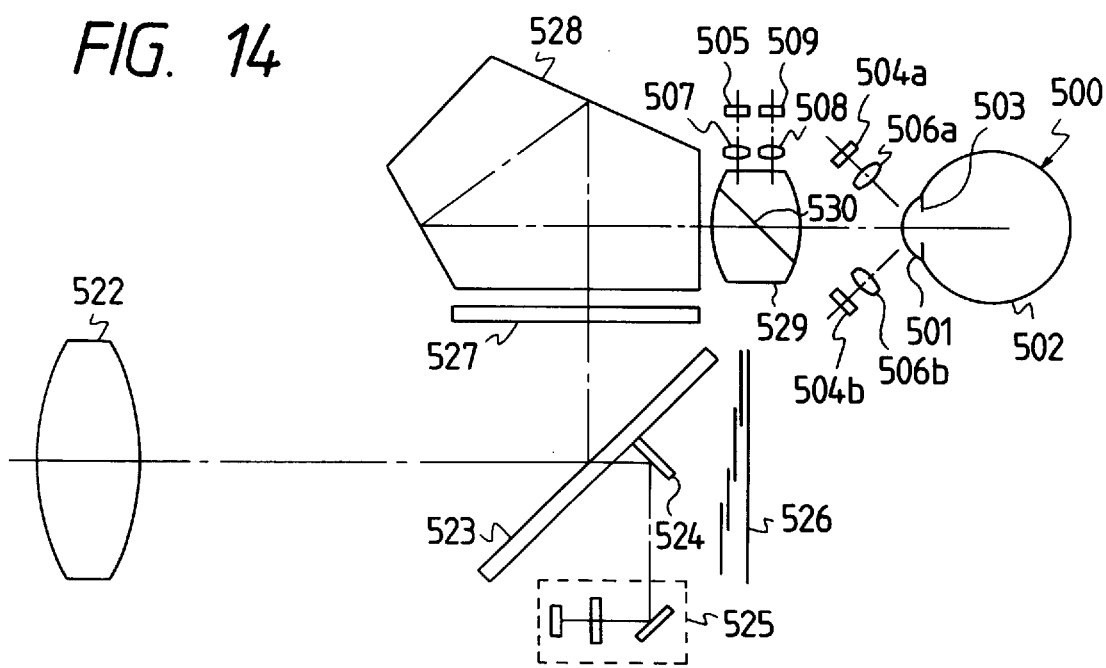
FIG. 14 is a view showing the essential constitution wherein a sight line detector according to the present invention is incorporated into a single lens reflex camera.

FIG. 14 is a view showing the essential constitution of a sight line detector according to the sixth embodiment of the present invention, wherein like reference numerals are attached to the same parts as used in FIG. 5.

This embodiment is a single lens reflex camera using a TTL finder as the image display unit.

In FIG. 14, 522 is an objective lens, and 523 is a main mirror. 524 is a sub-mirror for reflecting downward the light flux transmitted through the main mirror 523 into a focus detector 525. 526 is a shutter, 527 is a focusing screen, 528 is a pentaprism, 529 is an eyepiece, and 530 is a dichroic mirror.

Light flux reflected from the main mirror 523 is imaged on the focusing screen 527, so that an image formed on the focusing screen 527 is transmitted through the pentaprism 528 and the eyepiece 529 onto the retina of the eyeball 500.

In the light path of a sight line detection system, an image of infrared ray emitted from light sources 504a, 504b and reflected from the cornea is formed via the dichroic mirror 530 on the image sensors 505, 509 for the sight line detection, respectively, as shown in the embodiment 5.

With the above constitution, a camera having sight line detection ability that is strong to the external light can be provided.

Next, a liquid crystal display unit having photoelectric conversion elements (sensors) will be described in more detail.

Figure 15:
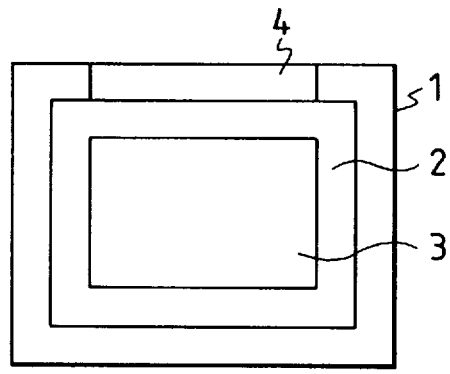
FIG. 15 is a schematic plan view for explaining another example of a liquid crystal display unit according to the present invention.
Figure 16:
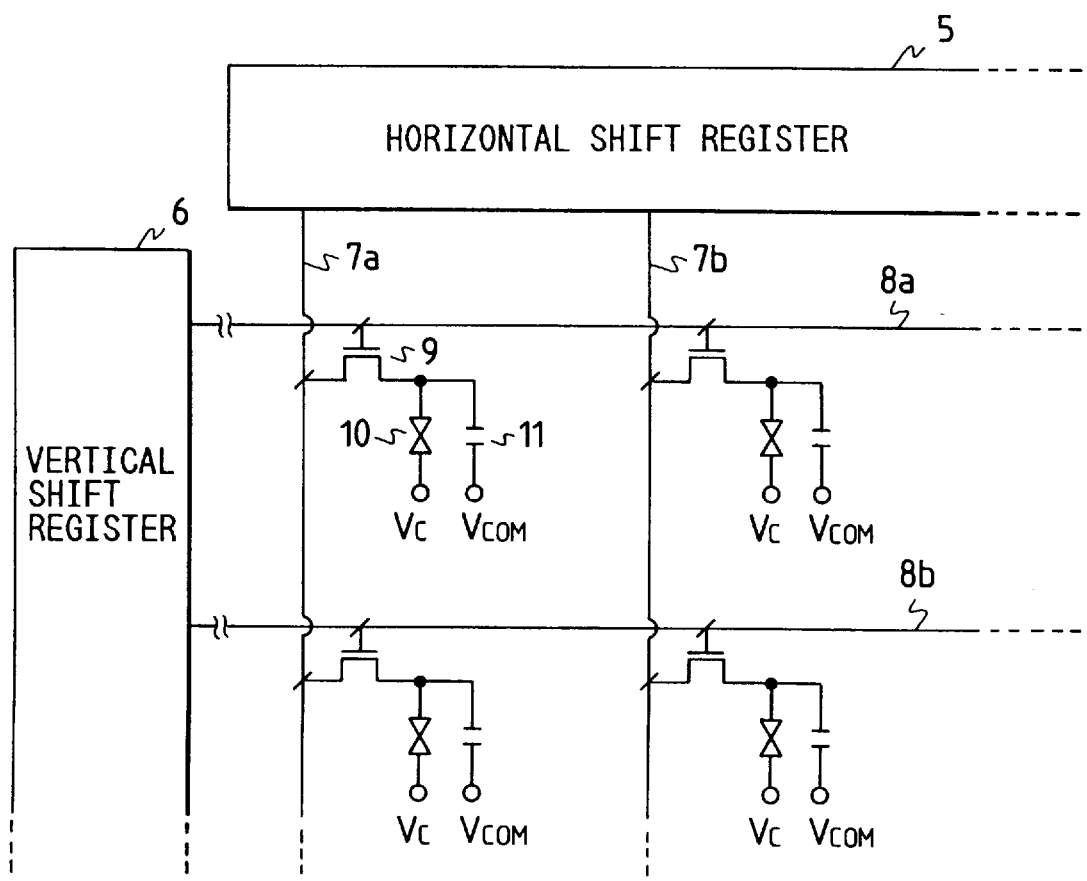
FIG. 16 is a circuit diagram for explaining a display and a driver for the liquid crystal display unit.

FIG. 15 is a schematic plan view of a liquid crystal display unit having photoelectric conversion elements according to the present invention, wherein 1 is an outer shape of panel, 2 is a drive circuit area, 3 is a display and 4 is a photoelectric conversion area. FIG. 16 is a circuit showing a part of the display and the drive circuit of the liquid crystal display unit, comprising a horizontal shift register 5 and a vertical shift register 6, as the drive circuit, and a TFT 9, a liquid crystal 10 and an auxiliary capacity 11 for each pixel. The horizontal shift register 5 driven by a synchronizing signal (not shown) of the image sends an image signal to the signal line 7a, 7b, which image signal is applied to a liquid crystal through the TFT 9 which can open or close upon a scan signal output from the vertical shift register 6, driven also by the synchronizing signal, to the scan lines 8a, 8b. The auxiliary capacity 11 is provided so that the voltage applied to the liquid crystal 10 may not fluctuate due to variations of the signal line 7a and the scan line 8a.

Figure 17:
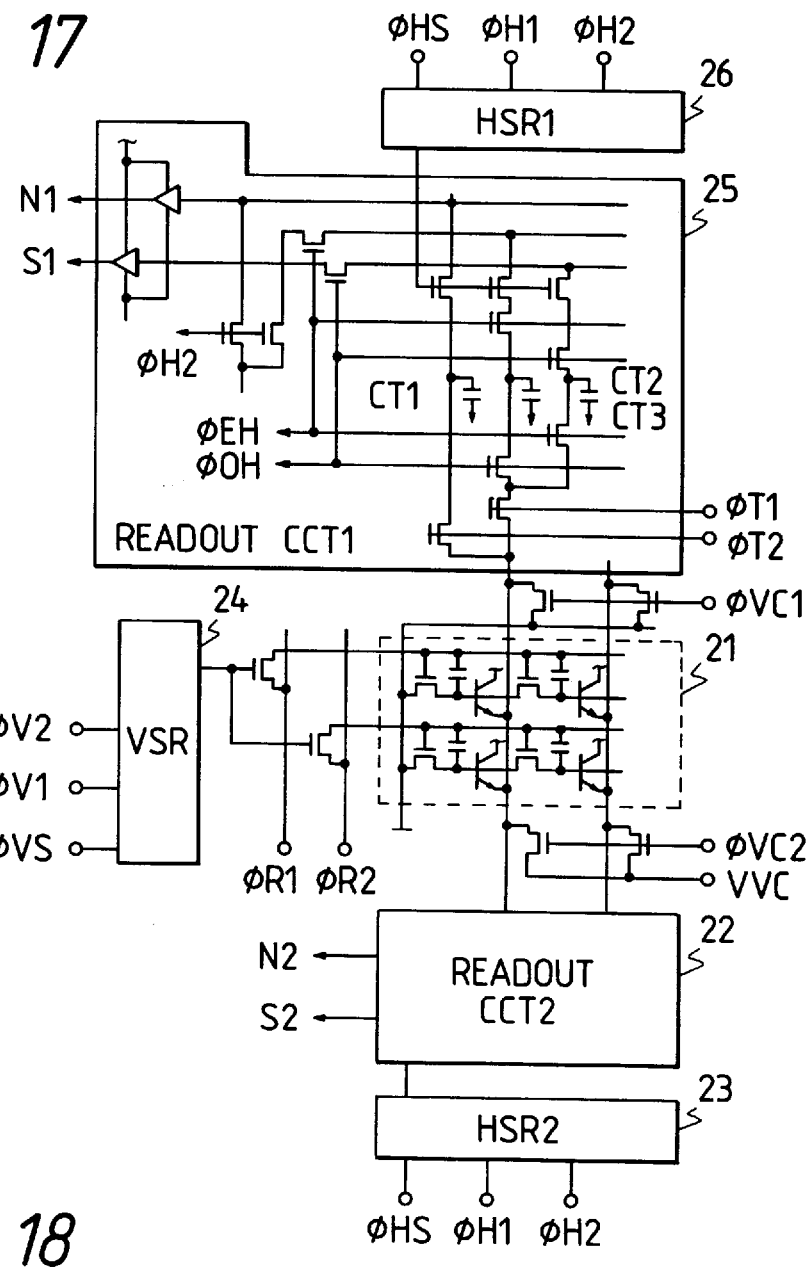
FIG. 17 is a circuit diagram of a photoelectric converter.

FIG. 17 shows a circuit diagram of a photoelectric converter, comprised of a BASIS (Base Store-type Image Sensor) area sensor wherein bipolar amplification-type sensors are arranged in two dimensions. The detail operation of this area sensor is described in, for example, "Technical Digest", 1989 IEEE solid-state circuit conference, pp. 96 to 97. In the above description, a sensor for detecting the visible light is provided, but a sensor suitable for infrared ray can be easily obtained by making a slight change of sensor structure as will be described later. In FIG. 17, a sensor section 21 is supplied with a read pulse by the vertical shift register 24, and outputs a photoelectric conversion signal to the reading circuits 22, 25. Output signal is sequentially read out by the horizontal shift registers 23, 26. Note that this circuit contains a fixed pattern noise automatic suppression circuit whereby the final signal is a difference between signal component S1 and photoelectric conversion noise component N1, as indicated at 25. The reason why two reading circuits 22, 25 and two horizontal shift registers 23, 26 are provided is to lower the drive frequency of the horizontal shift register, wherein two circuits may not be necessarily provided if the higher speed is attained with fine structure.

Figure 18:
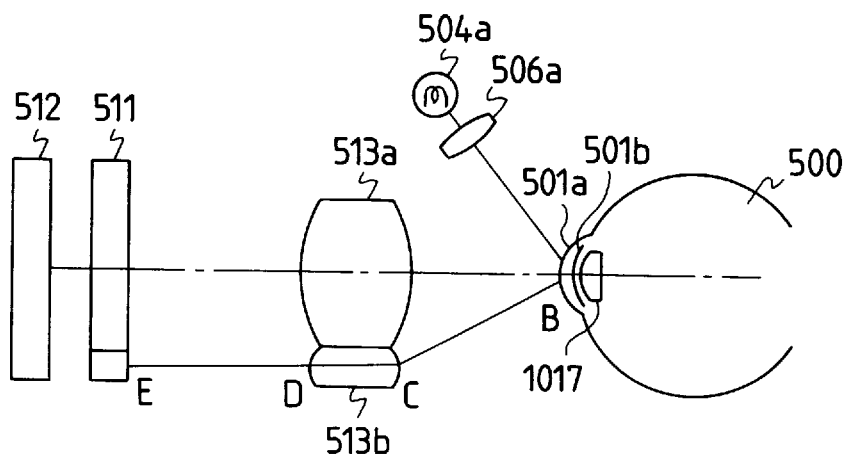
FIG. 18 is a typical view for explaining an optical system of a sight line detecting system.

FIG. 18 is a typical view showing an optical system where a sight line detection system is constituted by using a liquid crystal display unit of the present invention. Visible light emitted from a backlight 512 projects an image of a liquid crystal display panel 511, which image passes through a display panel convex lens 513a to be incident on the eyeball 500. On the other hand, an infrared light source 504a for the sight line detection is converged by a condenser lens 506b, and reflected against a cornea face 501a or a cornea back face 501b to be incident on a condenser convex lens 513b for photoelectric conversion. The shape of the convex lens 513b is determined so that incident light is imaged on a photoelectric converter residing on the plane of the liquid crystal display panel 511.

As described above, in the present invention, by providing a photoelectric converter usable for the sight line detecting system on the liquid crystal display unit, the total system can be configured in smaller size and with higher performance.

However, an active matrix-type liquid crystal display unit using a thin film transistor (TFT) is fabricated by, for example, forming a thin film semiconductor layer composed of Si on the transparent substrate, and providing TFTs as the switching elements on this thin film semiconductor layer, as described above. Transparent electrodes of ITO are formed thereon to provide liquid crystal drive electrodes. The input side of TFT is connected to the signal wiring, and the output side thereof is connected to the liquid crystal drive electrode. The image can be displayed by sending each pixel electrode video signal in synchronization between the gate signal to be input into the gate wiring for controlling the TFT and the video signal to be input into the signal wiring.

When an electronic view finder is constituted by the liquid crystal display unit, it is not practical to attach an input pad to each of gate wirings and signal wirings to make a connection to the drive circuit, because of its small size. Thus, it is general to form a liquid crystal drive circuit and the liquid crystal display on the same substrate.

And if a photodetector and a photodetector driver are constituted on the same substrate as the liquid crystal display unit, it is possible to construct the liquid crystal display unit having a sight line detection feature compactly and cheaply, and further to feed back the output from the sight line detector to the liquid crystal display unit.

However, in constituting the liquid crystal display unit and the sight line detector of one chip, the following problems may be often encountered.

The thin film semiconductor layer for use in the display and drive circuit of the liquid crystal display unit is single crystal or polycrystal, and can not be said to be best for the photoelectric conversion area. Because almost light can be transmitted through the thin film semiconductor layer with the thickness of semiconductor layer, the detection efficiency often decreases. For single crystal Si, for example, when the wavelength of detection light is 800 nm with an Si film thickness of 0.5 $\mu$m, the quantum efficiency is 5%. Accordingly, when the quantum efficiency of 80% or more is required, the Si film thickness must be 16 $\mu$m or greater.

Accordingly, it is preferable that, by forming the photoelectric converter for the photodetector in the liquid crystal display unit of an optimal semiconductor material, for example, amorphous Si (hereinafter referred to as a-Si), the photodetector has a higher detection efficiency.

In the following, the liquid crystal display unit having light receiving means (sensor) such as photoelectric conversion element according to the present invention will be described in detail in connection with the specific embodiments.

[Embodiment 7]

Figure 19A:
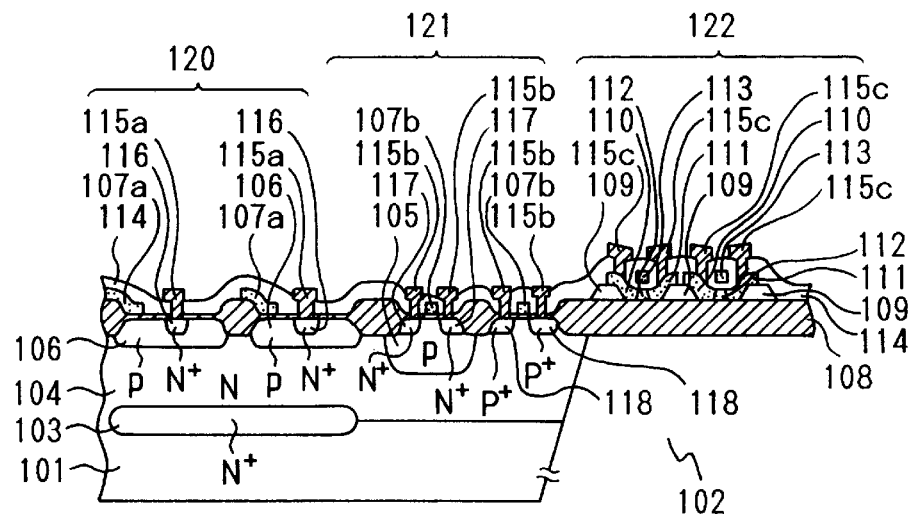
FIG. 19A is a typical cross-sectional view showing a substrate of a liquid crystal display unit as described in embodiment 7.

FIG. 19A is a typical cross-sectional view showing a display 122, a drive circuit 121, and a photoelectric converter 120 integrated on a silicone substrate. This embodiment utilizes polysilicone as the active layer of pixel TFT, the drive circuit of CMOS constitution, and a bipolar amplification-type sensor as the photoelectric converter.

The photoelectric converter 120 has a bipolar transistor composed of an epitaxial layer 104 as the collector, a base region 106 and an emitter region 116, and a reading capacitor composed of the capacitive coupling between polysilicone 107a and the base region 106. The epitaxial layer 104 has suitably a thickness of 5 to 20 $\mu$m to convert photoelectrically infrared ray. Also, a buried layer 103 reduces the collector resistance, as well as reducing the dark current by suppressing the diffusion current from the substrate which occurs when the silicone substrate 101 is of the same type as the epitaxial layer. The drive circuit 121 is a CMOS, comprised of an NMOS made within P well 105 and a PMOS made within the epitaxial layer 104. The display is comprised of TFTs of n-type or p-type polysilicone channel. The thickness of polysilicone channel 112 is permitted in the range from several hundreds to several thousands Å, but can be determined to an appropriate thickness in consideration of the magnitude of the leak current of TFT and the source-drain resistance. A hollow portion 102 is formed by wet etching a part of the silicone substrate 101 and the epitaxial layer 104, for example, with an aqueous solution having 2.38 wt % of KOH (potassium hydroxide) tetramethyl-ammoniumhydroxide (TMAH). By removing a silicone layer opaque to visible light in this way, the display is made transparent.

Figure 19B:
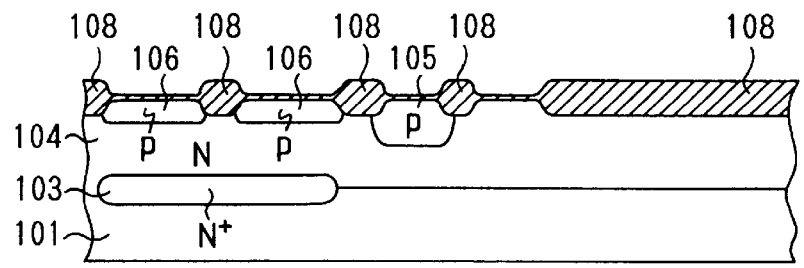
FIGS. 19B to 19D are typical cross-sectional views for explaining its fabrication process, respectively.
Figure 19C:
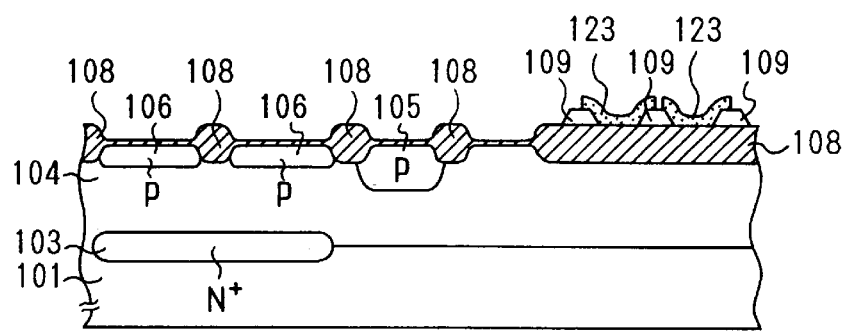
Figure 19D:
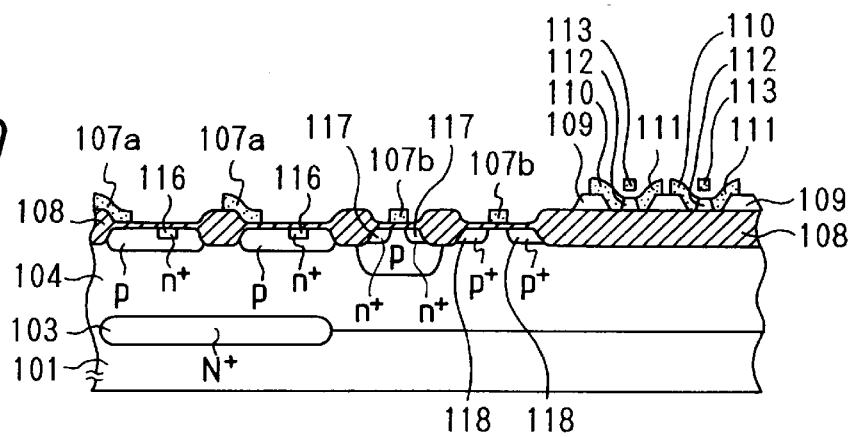

A manufacturing process for providing the structure of the present invention will be described with reference to typical cross-sectional views of FIGS. 19B to 19D. First, after a buried layer 103 is formed on a silicone substrate 101, an epitaxial layer 104 of Si is deposited 5 to 20 μm thick. Then, $SiO_2$ and silicone nitride film are grown on the surface of the epitaxial layer and patterned. And an LOCOS oxide film 108 is formed by LOCOS. This oxide film serves as the element separation between drive circuit and photoelectric converter and the etching stopper for the hollow in the display. Thereafter, P-well region 105 and base region 106 are formed as shown in FIG. 19B. After separation region 109 is formed with a non-doped polysilicone layer, polysilicone 123 is deposited to form an active layer (FIG. 19C). Thereafter, polysilicone is deposited to form reading capacitor 107a, CMOS gate 107b, and TFT gate 113. Subsequently, emitter 116, NMOS source-drain 117, and TFT source-drains 110, 111 are formed by ion implantation (FIG. 19D). After an interlayer insulating layer 114 is deposited, electrodes are formed of aluminum, whereby the constitution of FIG. 19A results.

As described above, in this embodiment, the photoelectric converter and the drive circuit as well as TFTs are integrated on a high quality silicone substrate, by utilizing the polysilicone process and the LOCOS oxidation technique.

With the constitution of this embodiment, a highly sensitive photoelectric converter, a drive circuit and a liquid crystal display can be integrated on the same silicone substrate, so that the liquid crystal display panel having a sight line detecting feature can be fabricated cheaply and in compact. In particular, this embodiment does not require that TFTs for the display are formed on an expensive, uncontrollable glass substrate, so that the substrate can be cheap, and the conventional integrated circuit manufacturing process can be used directly.

[Embodiment 8]

Figure 20A:
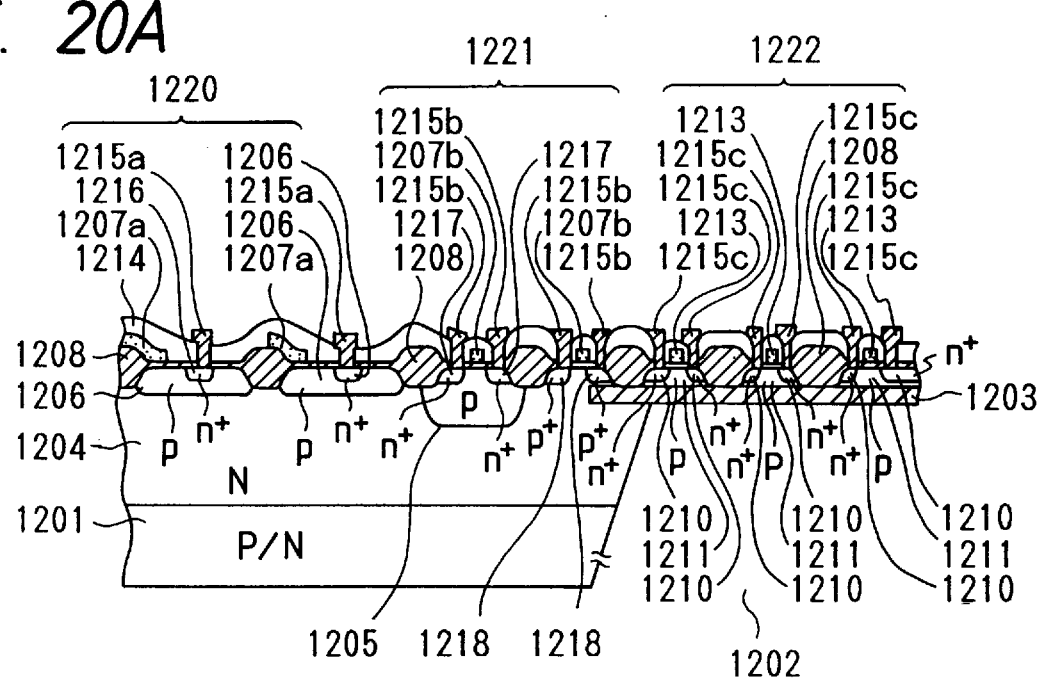
FIG. 20A is a typical cross-sectional view showing a substrate of a liquid crystal display unit as described in embodiment 8.

FIG. 20A is a typical cross-sectional view of a liquid crystal panel for explaining the eighth embodiment of the present invention. A photoelectric converter 1220 consists of a bipolar transistor composed of an epitaxial layer 1204 as the collector, base region 1206, and emitter region 1216, and reading capacitor composed of the capacitive coupling between polysilicone 1207a and the base region 1206. A drive circuit 1221 is a COMS, comprised of an NMOS made within P-well 1205 and a PMOS made within the epitaxial layer 1204. A feature of this embodiment is that the active layer of TFT on the display is single crystal silicone. TFTs reside on buried insulating film 1203, and NMOS channel region 1211 and source-drain region 1210 are formed with the same process as the drive circuit.

In this embodiment, the silicone substrate for the display is made transparent by etching (hollowing), as in the embodiment 7, the buried insulating film 1203 serving as the stopper in etching.

Figure 20B:
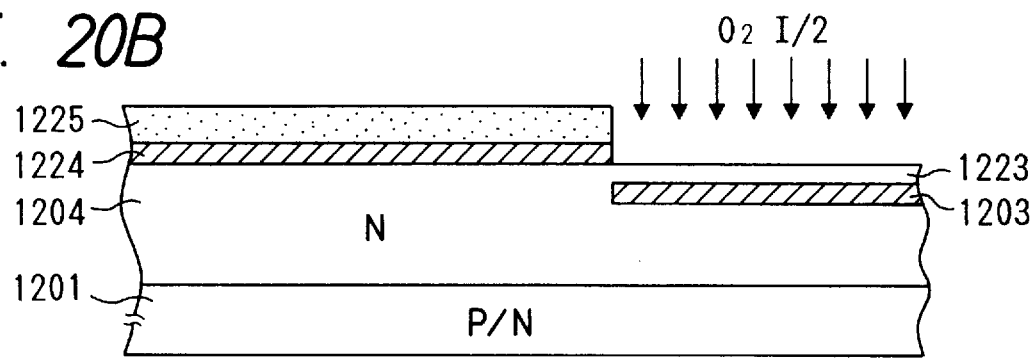
FIGS. 20B to 20C are typical cross-sectional views for explaining its fabrication process, respectively.

An example of the manufacturing process to form the structure of the present invention will be described below, using the typical cross-sectional views of FIGS. 20B and 20C.

First, to form a buried insulating layer 1203, the surface of epitaxial layer 1204, except for the display, is covered with a thermal oxide film 1224 and an oxide film 1225 by vapor phase growth. Next, using a large current ion implanter, oxide ions as many as 4E17 to 2.4E13 (ions/cm$^2$) are implanted at 150 to 300 KeO. After implantation of oxide ions., the annealing is made at a temperature of 1100° to 1250° C. for the time period from two to twenty hours to form the buried insulating layer (oxide film) 1203 having a thickness of 2000 to 5000 Å (FIG. 20B).

Figure 20C:
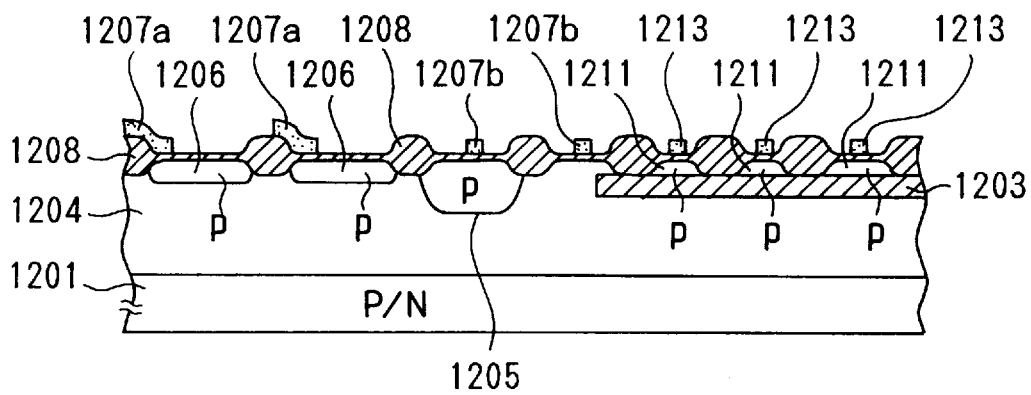

Next, a TFT channel region 1211 for the P-well 1205 of the drive circuit and a base region 1206 of the photoelectric converter are formed, and by deposition of polysilicone and patterning, a reading capacity electrode 1207a in the photoelectric converter, a gate electrode 1207b in the drive circuit, and a TFT gate electrode 1213 are formed (FIG. 20C).

By ion implantation, an emitter 1216, CMOS source-drains 1217, 1218, and a TFT source-drain 1210 are formed, and after an interlayer insulating film 1214 is deposited, an electrode is formed of aluminum, whereby the constitution of FIG. 20A results.

In this embodiment, as the TFT active region is single crystalline silicone, the TFT with small leak current and large driving power can be easily obtained. With the experiments, it is shown that the leak current is below 10 (fA) per pixel, and the TFT current driving power is above ten times that of polysilicone TFT, whereby 64 or more gradations in black and white can be implemented with the liquid crystal display. Also, since a sufficient drive power can be obtained with the gate width of TFT of 3 μm or less, the numerical aperture of pixel can be increased, where a liquid crystal panel having 300 thousands or more pixels can be implemented. Also, since the photoelectric converter and the drive circuit have the equivalent performance to that of embodiment 7, a highly precise liquid crystal display panel of high gradation having the sight line detection feature applicable can be realized.

[Embodiment 9]

Figure 21A:
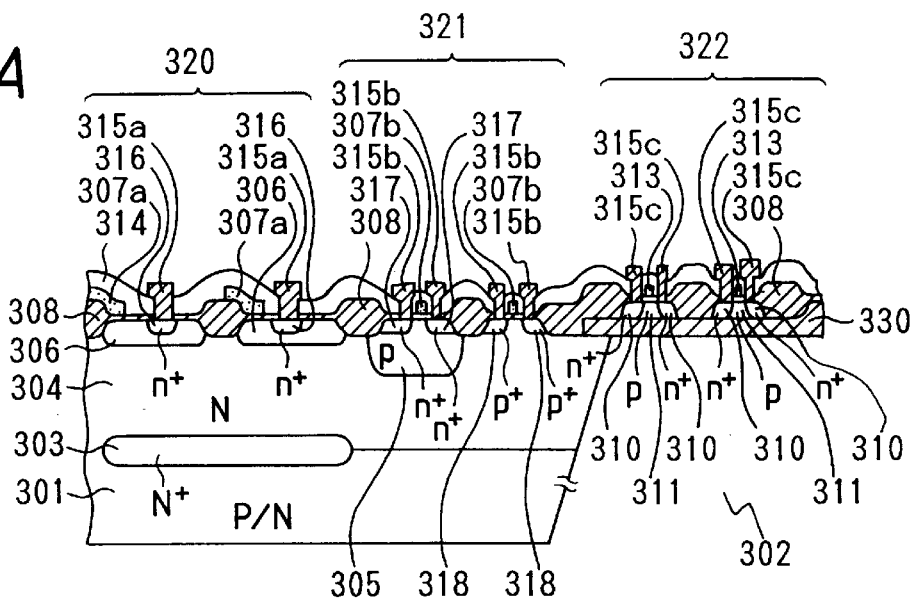
FIG. 21A is a typical cross-sectional view showing a substrate of a liquid crystal display unit as described in embodiment 9.

FIG. 21A is a typical cross-sectional view of a liquid crystal panel for explaining the ninth embodiment of the present invention. A photoelectric converter 320 consists of a bipolar transistor composed of an epitaxial layer 304 as the collector, a base region 306, and an emitter region 316, and a reading capacitor composed of the capacitive coupling between polysilicone 307a and the base region 306. A drive circuit 321 is a CMOS, comprised of an NMOS made within a P-well 305 and a PMOS made within the epitaxial layer 304. A feature of this embodiment is that the active layer of TFT on the display is single crystal silicone, and a bonded substrate without expensive ion implantation of large current is used at reduced costs. TFTs reside on an insulating substrate as obtained by bonding, and the drive circuit and the photoelectric converter are made within the epitaxial single crystalline silicone 304 where the thin silicone layer 323 and insulating layer 330 on the insulating substrate are removed. As in the seventh and eighth embodiments, the silicone substrate for the display is made transparent by etching (hollowing), the buried insulating film 303 serving as the stopper in etching.

The manufacturing process to implement the structure of the present invention is the same as that of embodiment 8, except for the fabrication method of the substrate, and thereby, the manufacturing of the insulating substrate will be described below in detail, using the typical cross-sectional views of FIGS. 21B to 21D.

Figure 21B:
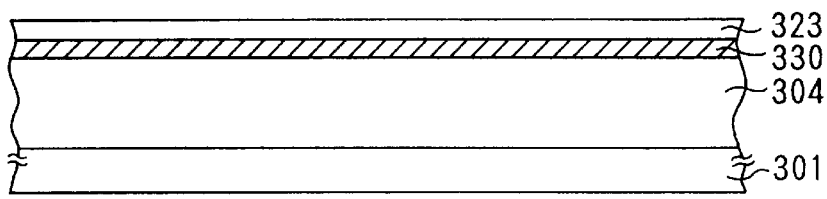
FIGS. 21B to 21D are typical cross-sectional views for explaining its fabrication process, respectively.

FIG. 21B shows a cross-sectional view of the insulating substrate. 323 is a thin film silicone layer, 330 is an insulating layer, 304 is an epitaxial layer, and 301 is a silicone substrate. This structure can be realized by bonding a first silicone wafer formed with epitaxial layer on the surface and a second silicone wafer formed with insulating film on the surface, which are opposed to each other, and then polishing the second silicone wafer to form a thin film silicone layer having a desired thickness. Of course, it suffices that a thinned single silicone layer is placed on the silicone substrate as insulated, and the fabrication method is limited to the above manner.

Figure 21C:
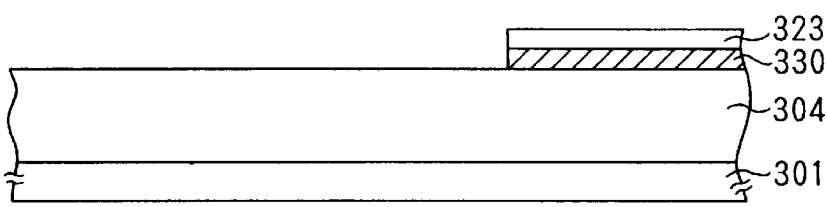
Figure 21D:
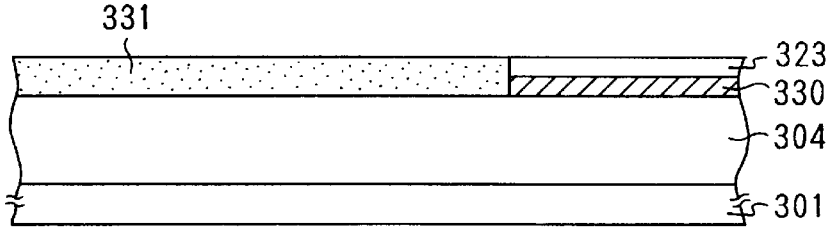

Next, the thin film silicone layer and insulating layer 330 on the silicone surface to serve as the drive circuit and photoelectric converter are removed from the substrate (FIG. 21C). Thereafter, the structure of FIG. 21A can be realized through the same manufacturing process as in the embodiment 8.

FIG. 21C shows a step of about up to 1 $\mu$m between the display and the other portion. Therefore, it is apprehended that the pattern dimension is different between upper and lower stages of the step, because the depth of focus can not be attained by pattern printing with the photolithography. One measure for solving this problem is to bury again silicone single crystal only in the lower region of the step, for example, as shown in FIG. 21D. For example, a selective epitaxial growth is performed after only the pixel portion is covered with the insulating film, or a single crystal growth is made by two frequency bias sputtering. In the case of FIG. 21D, the following manufacturing process is not different from that of FIG. 21C.

According to this embodiment, a high precision liquid crystal display panel of high gradation with the sight line detecting feature can provided by using an insulating substrate made by bonding.

As in the embodiment 8, the leak current for the pixel TFT is below 10 (fA) and the driving power is above ten times that of polysilicone TFT, whereby 64 or more gradations in black and white can be implemented with the liquid crystal display.

Further, the liquid crystal display panel can be provided at low manufacturing costs and with good yields because expensive ion implantation process of large current, which easily produces crystal defects, is not necessary.

[Embodiment 10]

This embodiment 10 of the present invention will be described below using FIGS. 22 and 23A to 23E, FIG. 22 is a typical cross-sectional view of a liquid crystal display unit with a photoelectric converter according to the present invention, and FIGS. 23A to 23E are typical cross-sectional views showing typically how to fabricate a substrate for the unit.

Figure 22:
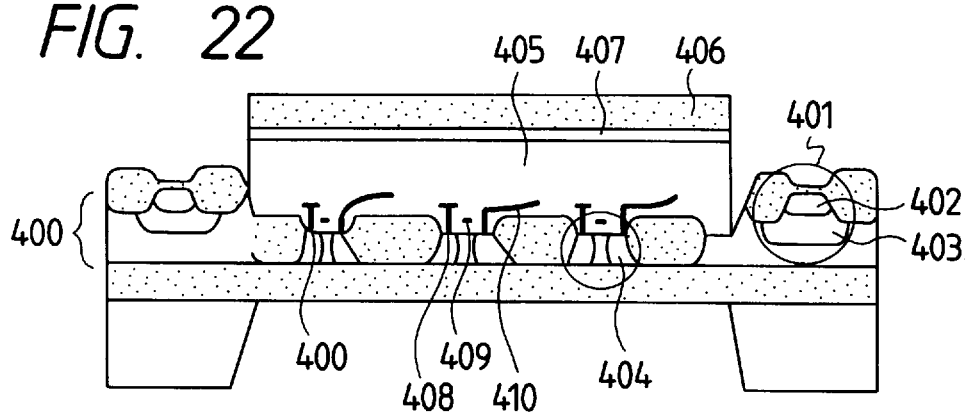
FIG. 22 is a typical cross-sectional view for explaining an embodiment of a liquid crystal display unit according to the present invention.

In FIG. 22, 401 is a photoelectric converter region, 402 is a p-type single crystalline region, and 403 is an n-type single crystalline region, 402 and 403 constituting a photodiode. The other structure is identical to that of the seventh to ninth embodiments, for example, and is not described any more. 404 is a switching transistor portion of the liquid crystal display, 408 is a signal line, 409 is a scan line, and 410 is a pixel electrode. 405 is a liquid crystal layer, 407 is a transparent electrode with a color filter, and 406 is a substrate having such components provided thereon. As indicated at 400, 400', the TFT semiconductor layer thickness of the liquid crystal display is thinner than the semiconductor layer in the photoelectric converter, wherein the optimal layer thickness can be formed by both layers.

In this embodiment, a photoelectric converter and a liquid crystal display are composed of single crystal layers provided on the insulating substrate, but different in thickness. This can be accomplished by etching the region of liquid crystal display to a desired thickness (several 100 Å to several 1000 Å), or making selective epitaxial growth on the SOI substrate only for the photoelectric converter to thereby thicken the single crystalline layer.

Further, a method of fabricating the substrate with the above structure without using any new process will be described below using FIGS. 23A to 23E.

Figure 23A:
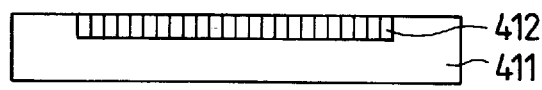
FIGS. 23A to 23E are typical cross-sectional views for explaining the fabrication method of a semiconductor substrate for use with the present invention, respectively.

In FIG. 23A, the area predefined to form the liquid crystal display region is made porous in a normal high density p-type substrate 411, as indicated at 412. This can be done by flowing a current of several A through a water solution having 49%HF alcohol added. It is necessary that the area having no porous layer formed is sealed to prevent the above solution from entering therein. The thickness of porous layer was 20 $\mu$m.

Figure 23B:
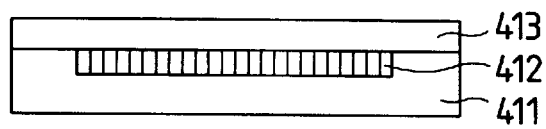
Figure 23C:
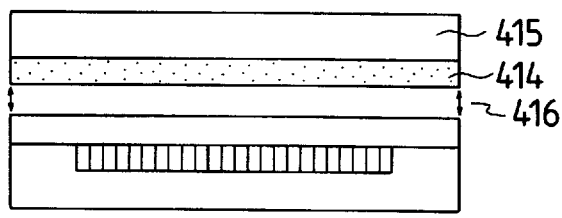

Next, a 3 $\mu$m thick epitaxial layer as indicated at 413 was formed on the surface of FIG. 23A by LP-CVD, as shown in FIG. 23B. Thereafter, a substrate 415 formed with oxide layer 414 is prepared (FIG. 23C), separately from the substrate, and bonded with the epitaxial layer surface of FIG. 23B, as shown at 416. They were bonded in the atmosphere of $N_2$ or $O_2$, and subjected to heat treatment at temperature of 1000° C. for the closer contact.

Figure 23D:
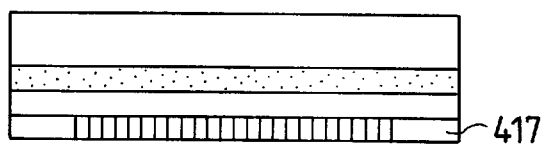

Next, the side of the substrate opposite the epitaxial layer was ground by a grinder until the porous layer was exposed, as indicated at 417 (FIG. 23D).

Figure 23E:
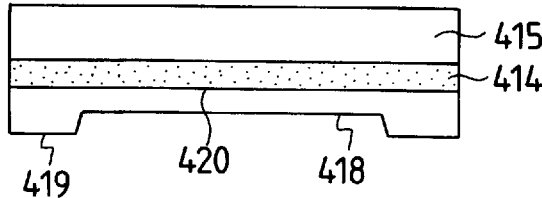

Finally, by immersing this wafer in $HF+H_2O_2$ (1:5) solution, only the porous layer were selectively removed as indicated at 418 in FIG. 23E. Thereby, a thin region 420 and a thick region 419 of single crystal Si layer could be formed. In this manner, any complicated process was eliminated to simply proceed to the next process.

It should be noted in this embodiment that the photoelectric converter may be of the CCD-type (Charge Coupled Device), with the drive circuit of a single channel structure or bipolar MOS hybrid structure, and TFT may be made of a-Si as the active layer or have the PMOS structure, wherein various variations may be made within the spirit or scope of the present invention.

[Embodiment 11]

The present invention will be described with a case where a liquid crystal display unit of the present invention is used for the video camera.

Figure 24:
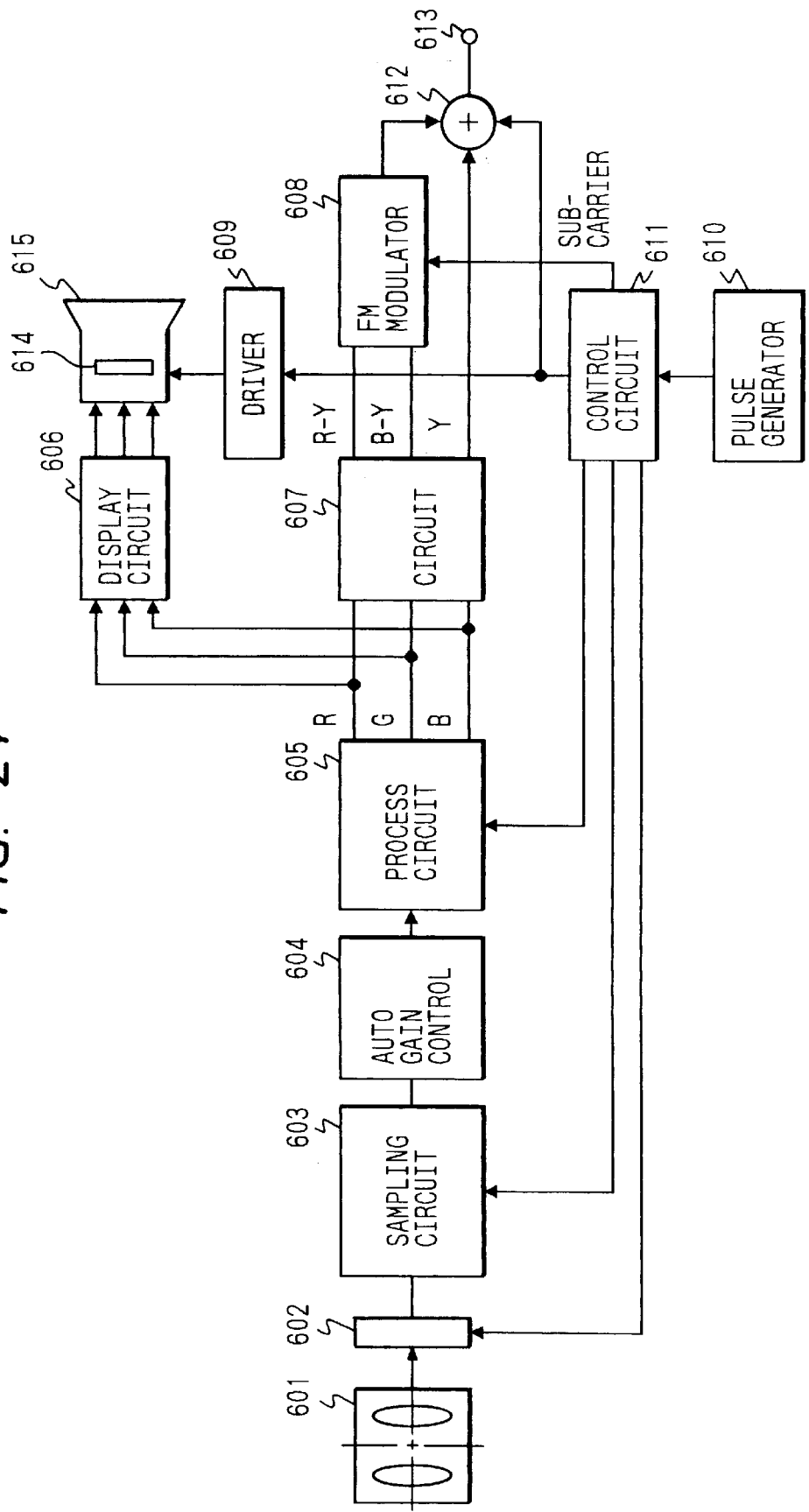
FIG. 24 is a typical constitutional view for explaining an embodiment of the constitution of an electronic camera.

FIG. 24 is a typical block diagram for explaining the configuration of a video camera.

In FIG. 24, 601 is an optical system having a lens and a diaphragm, and 602 is an image pickup element such as CCD. Light from the object not shown is transmitted through the lens 601 and imaged on and/or input into the image pickup element 602, where a light signal is photoelectrically converted into an electric signal which is then input into a sampling circuit 603. Subsequently, a photoelectrically converted output is adjusted by an automatic gain control 604, and input into a process circuit 605. In the process circuit 605, a signal based on the photoelectrically converted signal is processed to provide each signal of R, G and B. Each signal of R, G and B output from the process circuit 605 is input into a display circuit 606 for the view finder 615 and a processing circuit 607, respectively. Each signal of R, G and B input from the display circuit 606 is adjusted for a liquid crystal display 614 which is a display element within the view finder 615, and input into the liquid crystal display unit 614. Also, a signal from a driver 609 is input into the liquid crystal display unit 601 for displaying the image. From each signal of R, G and B input into the processing circuit 607, R-Y, B-Y and Y signals are created and output. Each signal of R-Y and B-Y is input into an FM modulator 608 for the FM modulation and an FM modulated signal is input into a demodulator 612. Note that subcarrier from the control circuit 611 is also input into the FW modulator 608. Y signal from the processing circuit 607 is also input into the demodulator 612. Pulses based on the pulses input from a pulse generator 610 to the control circuit 611 are synchronously input into the image pickup element 602, the sampling circuit 603, the process circuit 605, the driver 609, and the demodulator 612, so that the input/output of signal is controlled. The signal output from the demodulator 612 is output as a television signal from a terminal 613.

In recording the composite television signal, this signal may be output to a normal video recorder.

As a result of applying this liquid crystal display unit as described in the embodiments 7 to 10 of the present invention to a view finder of video camera with the above constitution, the focusing was performed, following the sight line of the observer, so that the focused display in viewing direction could be obtained at any time. And there were no troubles of operation because the focusing could be always attained in the direction of sighting.

An example in which a sensor for the liquid crystal display unit and at least a part of driving means for the liquid crystal display unit are shared will be described below in detail.

[Embodiment 12]

Figure 25:
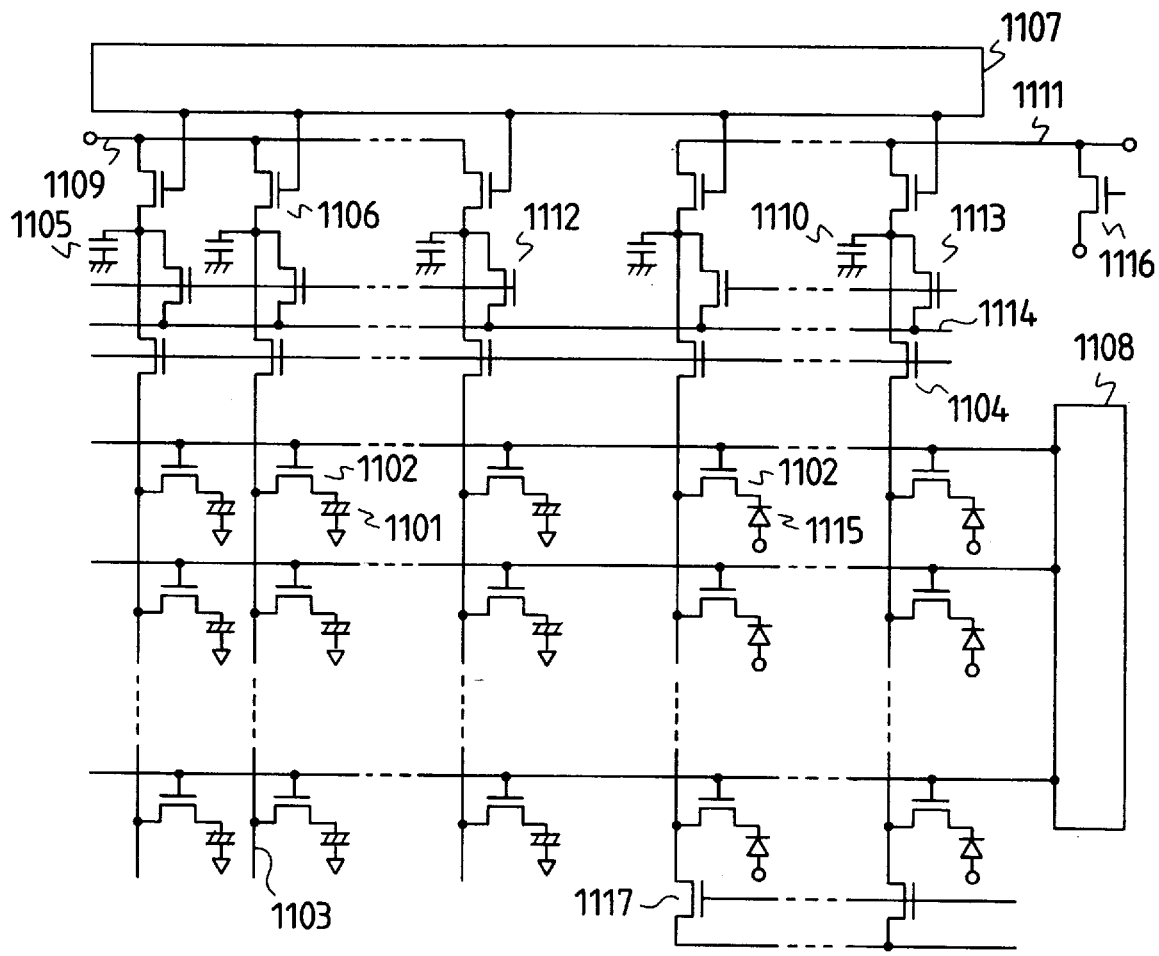
FIG. 25 is a schematic circuit diagram for explaining another embodiment of the present invention.

FIG. 25 is a view of a liquid crystal display unit according to this embodiment. 1101 is a capacitor of liquid crystal cell, 1102 is a switching TFT for applying a signal voltage to its liquid crystal cell or connecting a sensor with signal line, 1103 is a signal line, 1104 is a transfer gate, 1105 is a first buffer capacitor, 1106 is a switching TFT for storing external signal pulse in corresponding buffer capacitor, 1107 is a horizontal shift register for driving the switching TFT 1106, 1108 is a vertical shift register for driving the switching TFT 1102, 1110 is a second buffer capacitor, 1111 is an output terminal for outputting a sensor output signal to the outside, 1112 is a reset TFT for resetting the first buffer capacitor 1105, 1113 is a reset TFT for resetting the second buffer capacitor 1110, and 1114 is a reset signal line. 1105 is a photoelectric conversion element such as a photodiode. 1116 is a reset TFT for resetting the reset output terminal 1111. 1117 is a reset TFT for resetting the sensor.

Figure 26A:
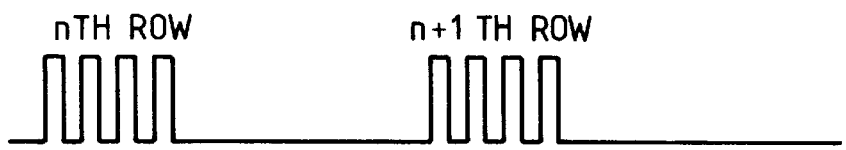
FIGS. 26A to 26H are drive timing charts as described in embodiment 12.
Figure 26B:
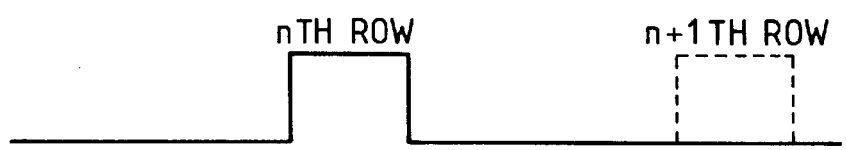
Figure 26C:
Figure 26D:
Figure 26E:

As the specific operation, the driving of an active matrix-type element of TN-type liquid crystal will be described in connection with timing charts as shown in FIGS. 26A to 26H. First, a video signal of one line is input sequentially through the external signal input end. A video signal of each pixel is transferred to the buffer capacitor 1105 by virtue of the switching TFT 1106 which is turned on/off by the horizontal shift register 1107 which performs the driving with pulses in synchronism with the frequency of the video signal (FIG. 26A). After the signal transfer of final bit of line to the buffer capacitor is ended, and before the video signal of the next line is input to the signal input end 1109, the pixel TFT 1102 is first turned on during so-called blanking period (FIG. 26B). Then, the reset TFT 1113 is turned on, and the voltage of the second buffer capacitor 1110 is reset (FIG. 26D). Then, the reset TFT 1113 is turned off and the transfer gate 1104 is turned on to read the sensor output from the photoelectric conversion element 1115 into the second buffer capacitor 1110 (FIG. 26C). At this time, when a non-amplification-type element such as a photodiode is used as the photoelectric conversion element, for example, the signal amplification read into the second buffer capacitor 1110 is determined by the capacity division ratio of the capacity of photodiode for storing signal charges to the buffer capacity 1110, and increases with small buffer capacity 1110. Further, the signal amplification read to the signal output end 1115 is determined by the capacity division ratio of the buffer capacity 1110 to the capacity added to the signal output end, and increases with larger buffer capacity 1110. The value of the buffer capacity 1110 is determined so that the signal amplification read to the signal output end 1115 may be maximum. The buffer capacity may be provided independently, or a parasitic capacity of the wiring.

The transfer gate 1104 is turned on after the sensor output is read, a video signal carried in the first capacitor 1105 is transferred to each pixel at the timing of FIG. 26C, when the sensor output is read to the second capacitor 1110. After the reading of sensor output and the transfer of video signal to the pixel are ended, the transfer gate 1104 is turned off, and the reset TFTs 1112, 1117 are turned on to reset the first capacitor 1105 and the sensor 1115.

Figure 26F:

A series of the reading of sensor output, the transfer of video signal to each pixel, and the reset of photoelectric element are performed during the blanking period. The variation in voltage of the photoelectric conversion element 1115 under such conditions is as shown in FIG. 26F. Optically produced carriers are stored during the time period since the reset is made at the timing of FIG. 26E during the blanking period until the switching TFT 1102 of the same pixel is turned on after one frame. If the pixel TFT 1102 and the transfer gate 1104 are turned on at the timing of FIG. 26C, signal charges stored are read into the second buffer capacitor 1110, so that the photoelectric conversion element 1115 reaches a voltage determined by the capacitive division ratio of its capacity to the second buffer capacity 1110. Then, the photoelectric conversion element 1115 is reset and the storage of signals corresponding to the next frame is started.

Figure 26G:

Also, the variation is voltage of display pixel serving as the liquid crystal display unit is as shown in FIG. 26G. A video signal voltage is transferred for each line at the timing of FIG. 26C and held for one frame. The transmittance of liquid crystal cell is changed in accordance with the signal voltage so that an image having desired density is displayed.

Figure 26H:

Several methods of applying video signal have been proposed, such as the frame inversion driving, the IH inversion driving and dot inversion driving, to solve the problems such as burning of liquid crystal molecules due to DC component, but the present invention is not limitative to those signal application methods. The sensor output is read in such a way that each signal of the second buffer capacitor 1110 is read into the sensor output end 1111 by the switching TFT 1106 which is turned on by the horizontal shift register 1107, as shown in FIG. 26H.

Figure 27:
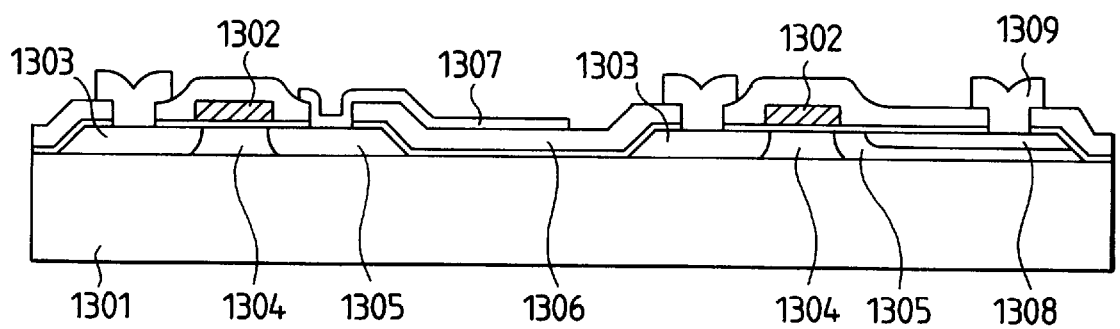
FIGS. 27 to 31B are typical cross-sectional views showing a display pixel and a photoelectric converter.

FIG. 27 shows a typical cross-sectional view of a video display pixel and a photoelectric conversion element for use in the present invention. 1301 is a transparent insulating substrate, and 1302 is a switching TFT gate electrode for connecting to the horizontal line for driving this apparatus. 1303 is a switching TFT source region for connecting to the vertical wiring. 1304 is a switching TFT channel region, 1305 is a switching TFT drain region, and 1305 is an interlayer insulating film. In the video display pixel, a transparent pixel electrode 1307 made of a material of ITO (Indium Tin Oxide), for example, is connected via a contact hole directly provided on this drain region 1305. The transmittance of liquid crystal on the transparent pixel electrode can be changed in accordance with the applied signal to the transparent pixel electrode 1307 to display a desired image.

Also, in the photoelectric conversion element, a semiconductor region 1308 having an opposite conduction type to that of drain region 1305 is provided in the drain region 1305, and an electrode 1309 is connected via the contact hole directly provided on this semiconductor region 1308.

A reset voltage is applied during the blanking period so that the drain region 1305 and the semiconductor region 1308 having opposite conduction type to that of drain region are first placed in reverse bias state. Then, the switching TFT is turned off to place the drain region in an electrically floating state. A depletion layer is spread between the drain region 1305 and the semiconductor region 1308, whereby pairs of electron and hole produced by photoexcitation are captured by the depletion layer and attracted by its electric field, one extinguishing on the electrode 1309 and the other stored in the capacity of depletion layer to act as an optical signal.

By adopting the constitutions and the driving methods as described above, there are provided the following effects:

1. No necessity of disposing the sight line detecting sensor separately, so that the system can be constructed in smaller size and at reduced costs.

2. No necessity of providing a new driving circuit for the sight line detecting sensor, or the possibility of significant simplification.

[Embodiment 13]

Figure 28:
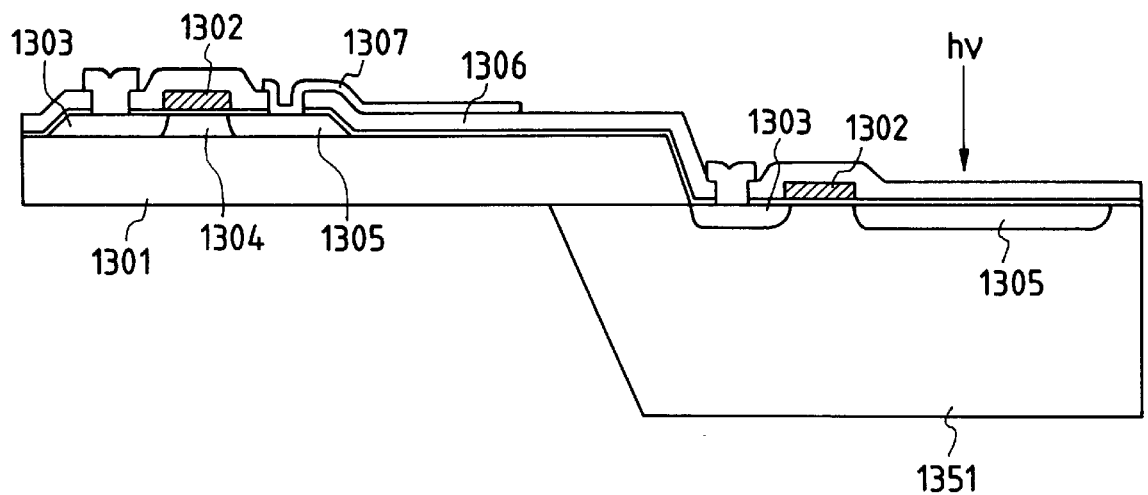

FIG. 28 is a view for showing the thirteenth embodiment of the present invention, and exemplifying the structure of an image display pixel and a photoelectric conversion element which is different from that of the embodiment 1. In the figure, 1351 is a semiconductor substrate, wherein a photodiode is formed between 1351 and 1305. The pixels for image display are provided on the transparent insulating substrate 1301 and the photoelectric conversion elements on the semiconductor substrate.

The amount of photocarriers collected in the photoelectric conversion element is proportional to the volume of a depletion layer in the photodiode, whereby the detection sensitivity of the photoelectric converter can be enhanced by forming the photodiode in the semiconductor substrate.

The structure of this embodiment can be easily realized using an SOI (Silicone On Insulator) substrate formed by bonding an insulating substrate and a semiconductor substrate or implanting oxygen ions into the semiconductor substrate, for example, in combination with the etching techniques.

[Embodiment 14]

Figure 29:
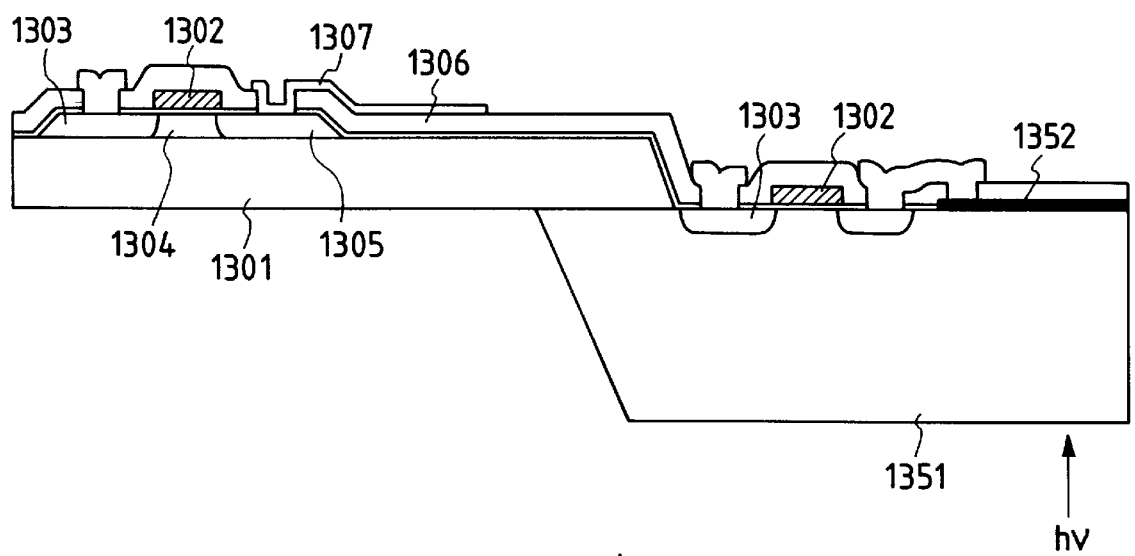

FIG. 29 is a view showing the fourteenth embodiment of the present invention, which is another embodiment of the photoelectric conversion element structure. 1352 is a metallic layer made of HgCdTe or PtSi, this layer forming a Schottky junction diode between it and the *semiconductor substrate.

The amount of photocarriers collected in the photoelectric conversion element is proportional to the volume of a depletion layer in the photodiode, whereby the depletion layer can be wider than the PN junction by using a Schottky junction as the photodiode, without causing any dielectric breakdown even if reverse bias is applied, so that the detection sensitivity can be enhanced.

[Embodiment 15]

Figure 30:
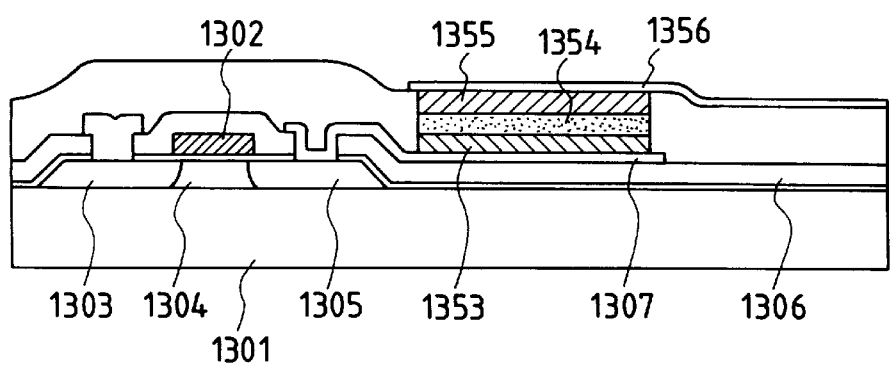

FIG. 30 is a view showing the fifteenth embodiment of the present invention, which is another embodiment of the photoelectric conversion element structure. 1353 is an n-type a-(amorphous) Si layer, 1354 is an a-SiGe layer, 1355 is a p-type a-Si layer, and 1356 is a transparent electrode. The band gap of a-SiGe layer is controllable by adjusting the flow of source gas in making film formation, ideally at about 1.45 eV.

The absorption coefficient of a-SiGe layer is greater by about one figure than that of single crystal Si, which results in a high detection efficiency even in the state of thin film.

[Embodiment 16]

Figure 31A:
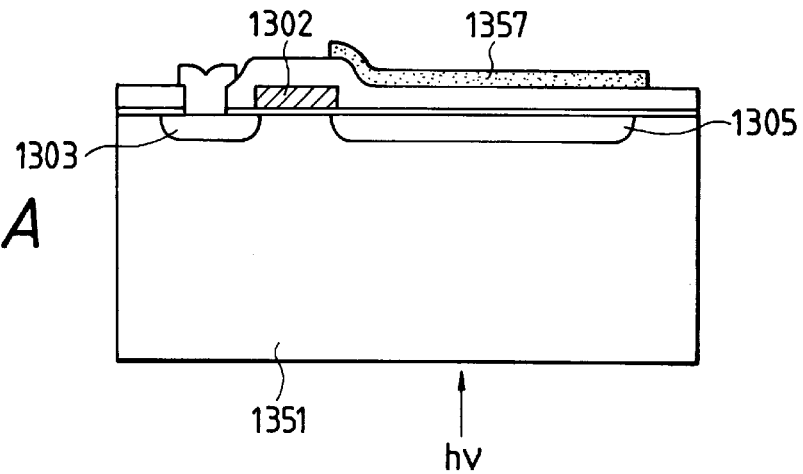
Figure 31B:
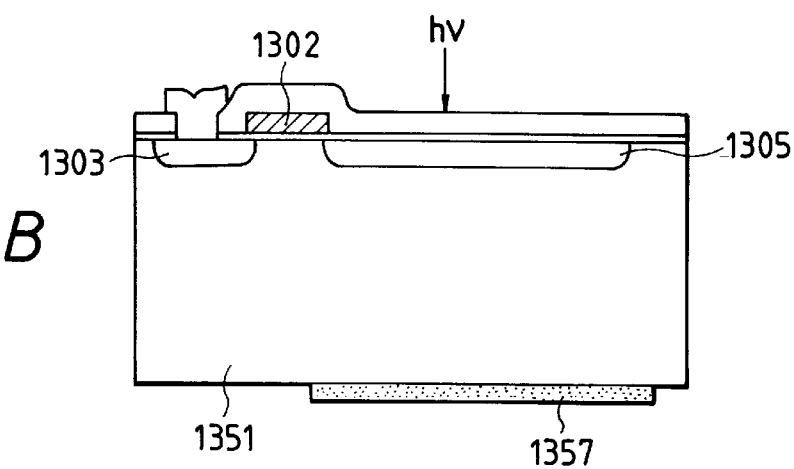

FIGS. 31A and 31B are views showing the sixteenth embodiment of the present invention, which is another embodiment of the photoelectric conversion element structure. In the figure, 1357 is a light reflection layer, made of a metal having high reflectance such as Al, for example. Because infrared ray usable for the sight line detection has a relatively long wavelength, the infrared ray can partially penetrate through the substrate when the semiconductor substrate 1351 is thin, and does not contribute to photoelectric conversion. As shown in FIGS. 31A and 31B, by providing a light reflection layer on the opposite side of the light incident surface of the substrate, the photoelectric conversion efficiency can be enhanced because of the capability of reflecting the light once penetrating through the semiconductor substrate. This embodiment is not limited to the photoelectric conversion element as shown in FIGS. 31A and 31B, but it will be appreciated that its combination with photoelectric conversion elements as shown in FIGS. 27 and 28 can be employed to the same effect.

[Embodiment 17]

Figure 32:
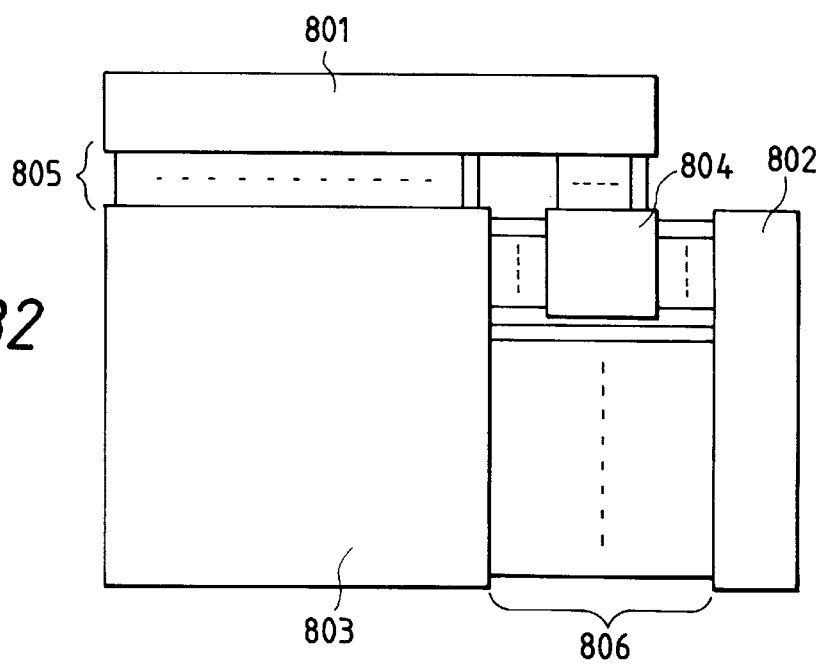
FIGS. 32 to 34 are schematic block diagrams showing a display unit of the present invention.

FIG. 32 is a view showing the seventeenth embodiment of the present invention, which is another embodiment concerning the arrangement of an image display area and a photoelectric conversion element area.

In FIG. 32, 801 is a horizontal shift register, 802 is a vertical shift register, 803 is an image display pixel area, 804 is a photoelectric conversion element area, 805 is a control line from the horizontal shift register, and 806 is a control line from the vertical shift register. Since the number of image display pixels and the number of photoelectric conversion elements for detecting the sight line are not necessarily equal in row and column, only a part of the control line 806 from the vertical shift register 802 may be shared between the image display pixel area 803 and the photoelectric conversion element area 804, as shown in the same figure.

[Embodiment 18]

Figure 33:
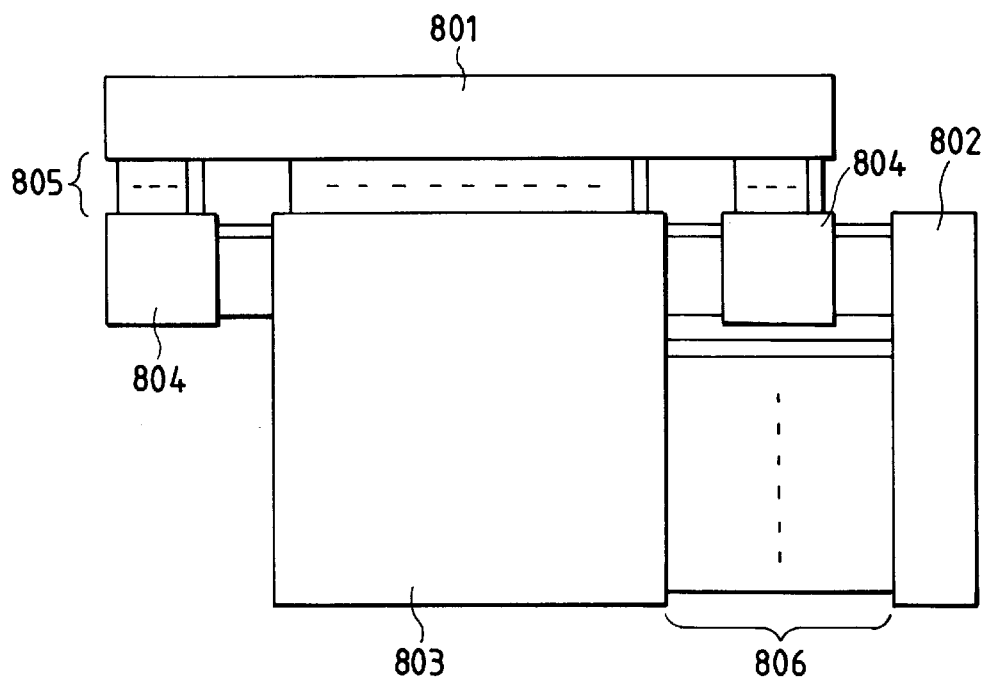

FIG. 33 is a view showing the eighteenth embodiment of the present invention, wherein a photoelectric conversion area is arranged on either side of the image display area. The provision of a plurality of photoelectric conversion areas can enhance the detection precision of detecting the sight line.

[Embodiment 19]

Figure 34:
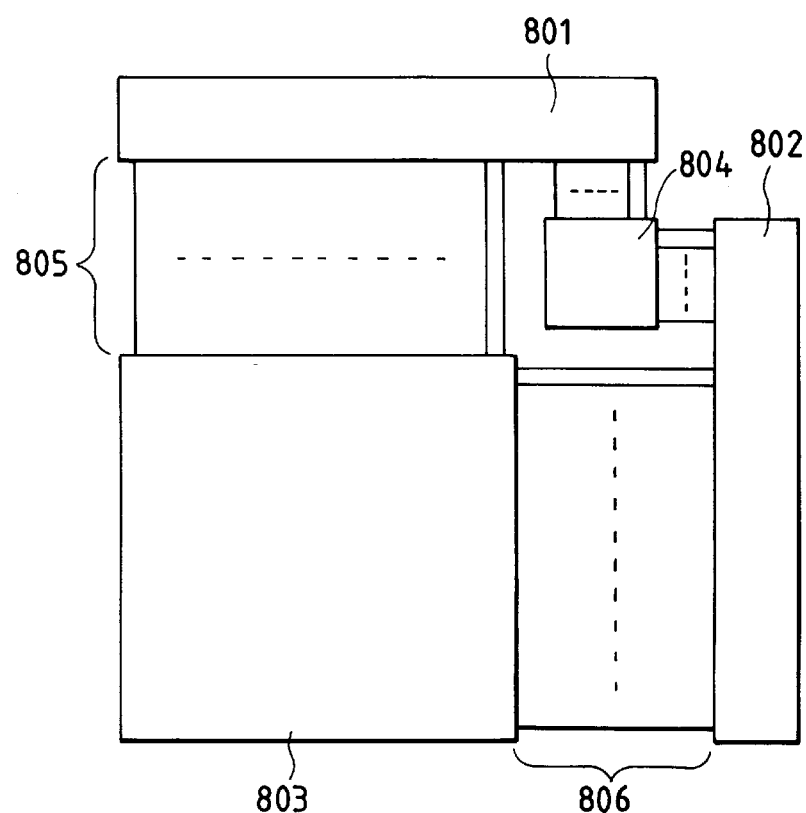

FIG. 34 is a view showing the nineteenth embodiment of the present invention, wherein a shift register is shared and the control line is provided independently in the image display area and the photoelectric conversion area. It is needless to say that this structure can also provide the same effect.

[Embodiment 20]

Figure 35:
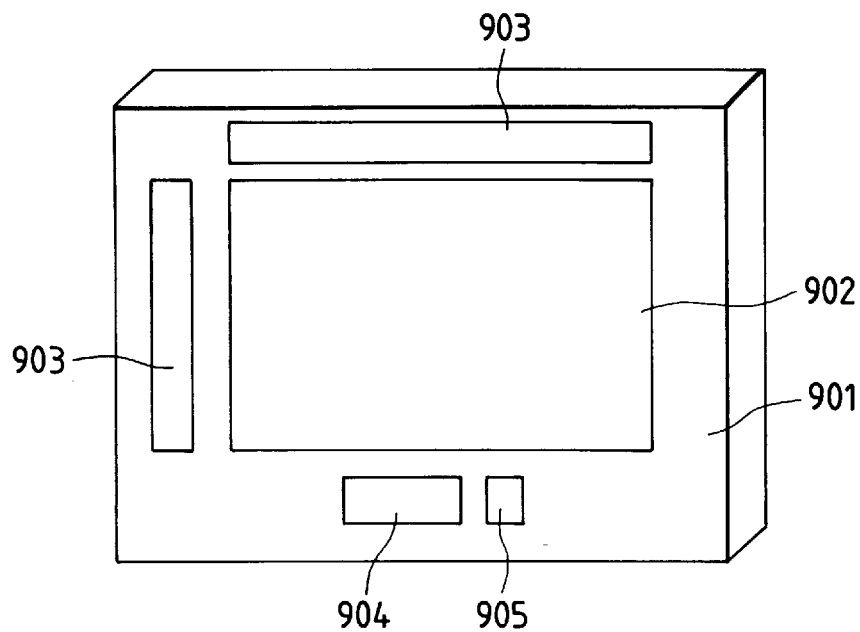
FIG. 35 is a typical perspective view for explaining another embodiment of the present invention.
Figure 36:
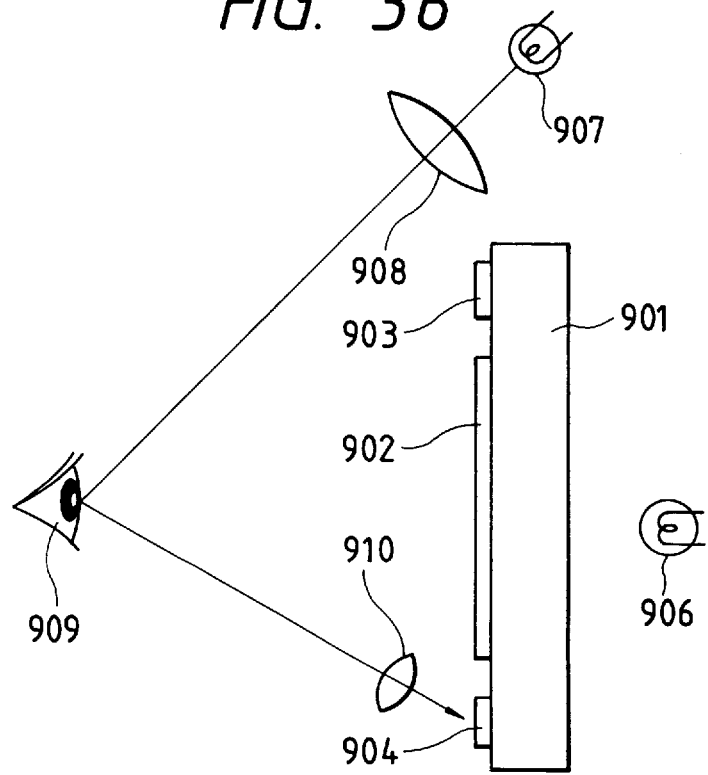
FIG. 36 is an operation diagram for explaining an embodiment 20 of the present invention.

FIG. 35 shows the twentieth embodiment of the present invention. This embodiment is an example of application to a liquid crystal device capable of detecting sight line by means of a sensor comprising an amorphous silicone as the semiconductor layer. In the figure, 901 is a substrate constituting a display unit, 902 is a liquid crystal display, 903 is a drive circuit of the liquid crystal display formed on the substrate 901, 904 is a photodetector for detecting the sight line, and 905 is a drive circuit for the photodetector. 901 to 905 are constituted on the same substrate 901.

The operation of the display unit in this embodiment will be described with reference to FIG. 26. A light source 906 is disposed on the back surface of the substrate 901 making up the liquid crystal display unit, and an image can be displayed by controlling the light transmittance through the pixels arranged as an array in the liquid crystal display 902 with the signal from the drive circuit 903. The sight line of the person peeping into the liquid crystal display can be detected in the following way.

On the substrate 901, a light detector 904 for the sight line detection and its drive circuit 906 are constituted. A light from the light source 907 for the sight line detection is made a parallel light through a lens 908 to illuminate the eye ball 909 of the observer. The light source 907 emits light having a wavelength useful for the sight line detection, practical example of which is infrared ray. A Purkinje image reflected from the eye ball 909 is formed on the photodetector 904 by a lens 910. Output from the photodetector 904 is processed in a signal processing circuit externally provided, so that the sight line from the eye ball 909 of the observer can be obtained. Or a signal processing circuit of the photodetector can be constituted on the substrate 901.

Figure 37A:
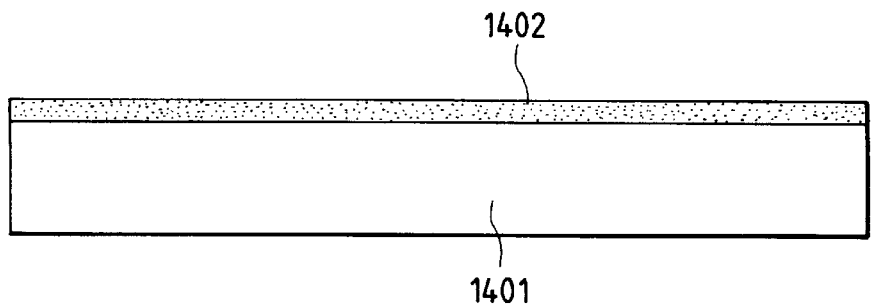
FIGS. 37A to 37C are views showing a manufacturing process of a device applicable with the embodiment 20 of the present invention.
Figure 37B:
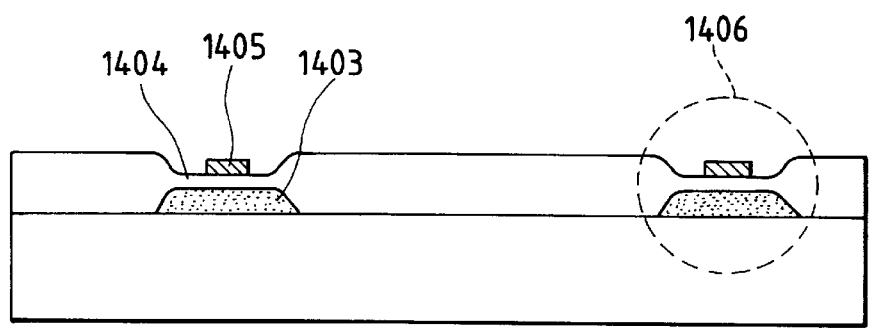
Figure 37C:
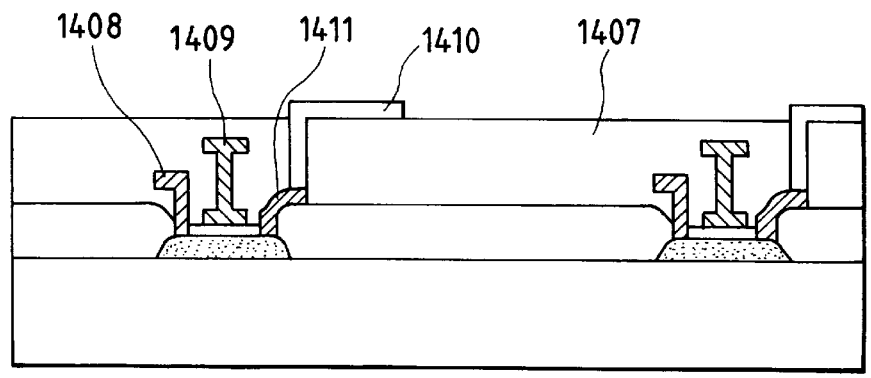

The manufacturing of this liquid crystal display unit is shown in FIGS. 37A to 37C. On a transparent substrate 1401 is formed a thin film semiconductor layer 1402 made of single crystal Si or poly-Si. Then, this thin film semiconductor layer 1402 is separated by etching or oxidation to form an active layer 1403. After a gate oxide film 1404 is formed on the active layer 1403, a gate electrode 1405 is deposited to form a transistor. An insulating layer 1407 is formed thereon, and then a signal wiring 1408 and a gate wiring 1409 are formed and connected to a source and a drain of the transistor 1406, respectively. The drain of the transistor 1406 is connected directly or via a drain electrode 1411 made of metal to a pixel electrode 1410. By sandwitching a liquid crystal between the substrate above fabricated and an opposed substrate, a voltage can be applied to the liquid crystal in accordance with the drain output voltage of the transistor 1406.

Figure 38:
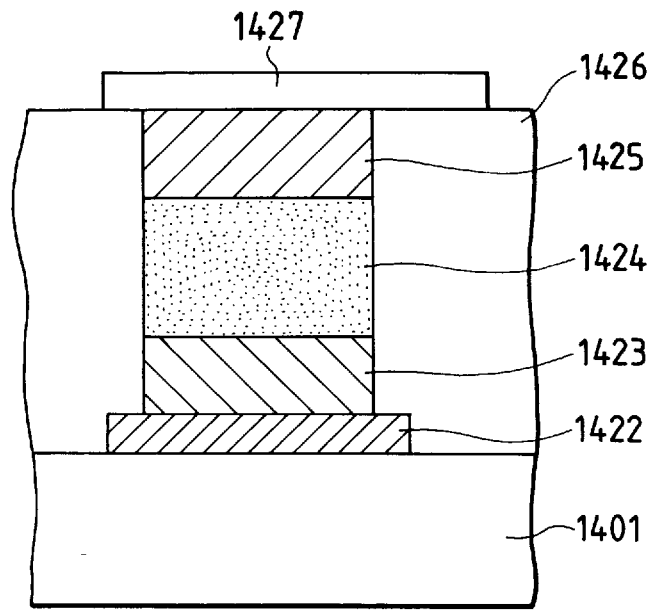
FIG. 38 is a cross-sectional view showing a constitutional embodiment of a photodetector according to the present invention.

The constitution of a photodetector formed on-chip by this liquid crystal display unit is shown in FIG. 38. 1401 is a substrate on which a liquid crystal display unit is formed. On the substrate is formed a metallic wiring 1422 made of Al. Further, an n-type a-Si 1423 is deposited on the metallic wiring 1422 by CVD, and an a-SiGe 1424 is formed thereon by plasma CVD. In this embodiment, the metallic wiring 1422 is spread to cover all the area for depositing a-SiGe 1424.

The plasma CVD method of a-SiGe will be described below. A wafer is placed on the electrode and heated up to 250° C. And an AC voltage of 13.56 MHz is applied between the electrode having the wafer thereon and the opposed electrode while a mixture gas of $SiH_4$, $GeH_4$ and $H_2$ is flowed therethrough, so that a-SiGe can be deposited on the wafer. At this time, the ratio of Si to Ge can be changed by adjusting the flow of $SiH_4$ and $GeH_4$, so that the band gap of a-SiGe can be controlled. In this embodiment, the band gap of a-SiGe is ideally set to about 1.45 eV.

After a p-type a-Si 1425 is vapor deposited by CVD on the a-SiGe 1424 deposited before, the n-type a-Si 1423, the a-Sige 1424, and the p-type a-Si 1425 are patterned by etching. Further, the structure of FIG. 38 can be obtained by forming an insulating film 1426 by PSG, for example, and forming a transparent electrode 1427. The material for the transparent electrode is typically ITO.

With this structure, an incident light penetrates through the transparent electrode 1427 and enters the a-SiGe region 1424 depleted. The absorption coefficient of a-SiGe is greater by about one figure than that of single crystal Si, and when the film thickness of a-SiGe is 1 μm, the quantum efficiency of 80% can be obtained in infrared ray having a wavelength of 800 nm. In this embodiment, the metallic wiring 1422 is spread over the entire area of light detection, and the light passing through the light detection area is reflected against the metallic wiring 1422 to again enter the light detection area, so that the detection efficiency can be further enhanced. On the other hand, the external light incident from the back side can be prevented from entering the detection area, because it is shielded by the metallic wiring 1422 even if transmitted through the transparent substrate 1421.

Also, it will be appreciated that a reflection plate may be provided on the back surface of the substrate 1401, but not on the metallic wiring 1422, to reflect the light as previously described.

With the above constitution, an incident luminous energy can be taken out as an electric signal by applying a bias between the metallic wiring 1422 and the transparent electrode 1427, as the absorbed detection light excites electrons and holes. It is needless to say that by disposing a filter capable of transmitting a desired infrared ray is disposed on the front surface of this detector, the influence of light except for infrared ray reflected from the eyeball can be reduced.

While in this embodiment, a-SiGe was utilized at 1425, it will be appreciated that a-SiSn may be used in the same effect of the present invention. Also, it is possible that a-Si layer 1423 is used as n-type and a-Si layer 1424 as p-type.

By providing a switching transistor in the photodetector above constituted and reading sequentially the output by the drive circuit 905 for photodetector as shown in FIG. 35, a Purkinje image can be measured so that the sight line of the observe can be obtained.

[Embodiment 21]

Figure 39:
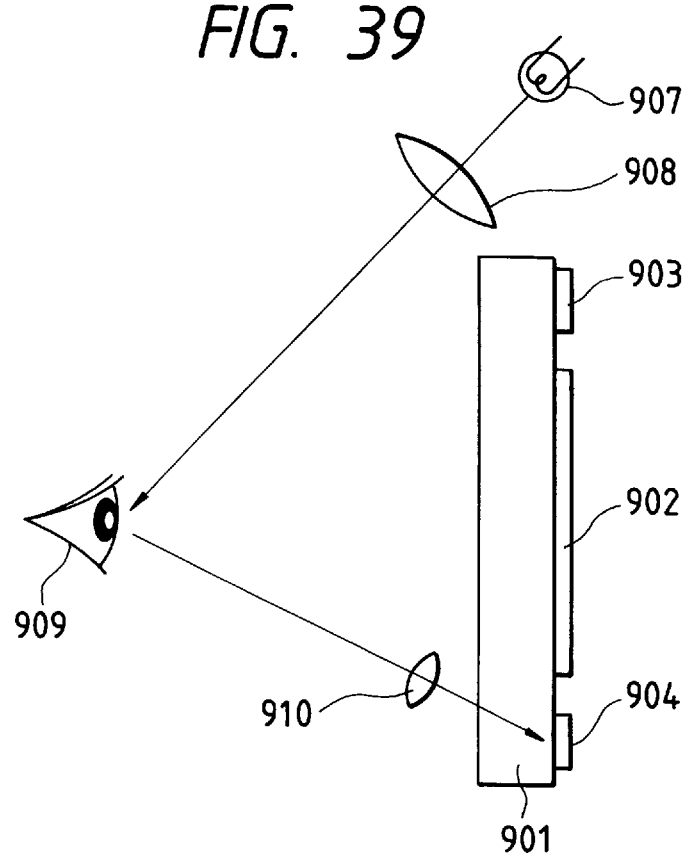
FIG. 39 is an operation diagram for explaining an embodiment 21 of the present invention.

A photodetector for detecting the light from the back side of the substrate was constituted with the same process as used in the embodiment 20. An operation diagram for explaining this embodiment is shown in FIG. 39.

Figure 40:
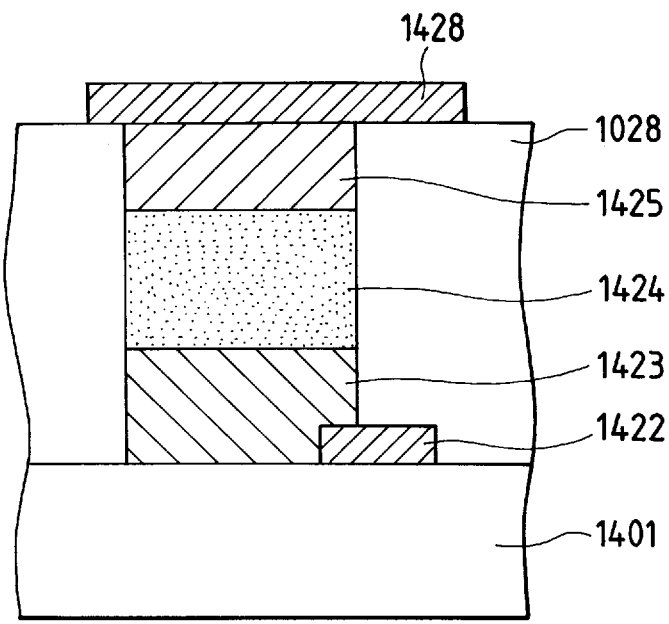
FIG. 40 is a cross-sectional view showing the constitution of a photodetector in an embodiment 21 of the present invention.

The operation mechanism and manufacturing of this embodiment are basically the same as those of the embodiment 20, except that the structure of photodetector 904 is different from that of embodiment 20, as shown in FIG. 40. In this embodiment, the metallic wiring 1422 makes contact with a part of the light detection area. Also, the metallic electrode 1428 made of Al is formed, instead of the transparent electrode 1427 in the embodiment 20.

In this embodiment, the metallic wiring 1428 is spread over the entire area of light detection, and the light passing through the light detection area is reflected against the metallic wiring 1428 to again enter the light detection area, so that the detection efficiency can be further enhanced. On the other hand, the external light incident from the surface of the substrate can be prevented from entering the detection area, because it is shielded by the metallic wiring 1428.

By providing a switching transistor in the photodetector above constituted and reading sequentially the output by the drive circuit 905 of the photodetector as shown in FIG. 35, a Purkinje image can be measured so that the sight line of the observer can be obtained.

[Embodiment 22]

Figure 41:
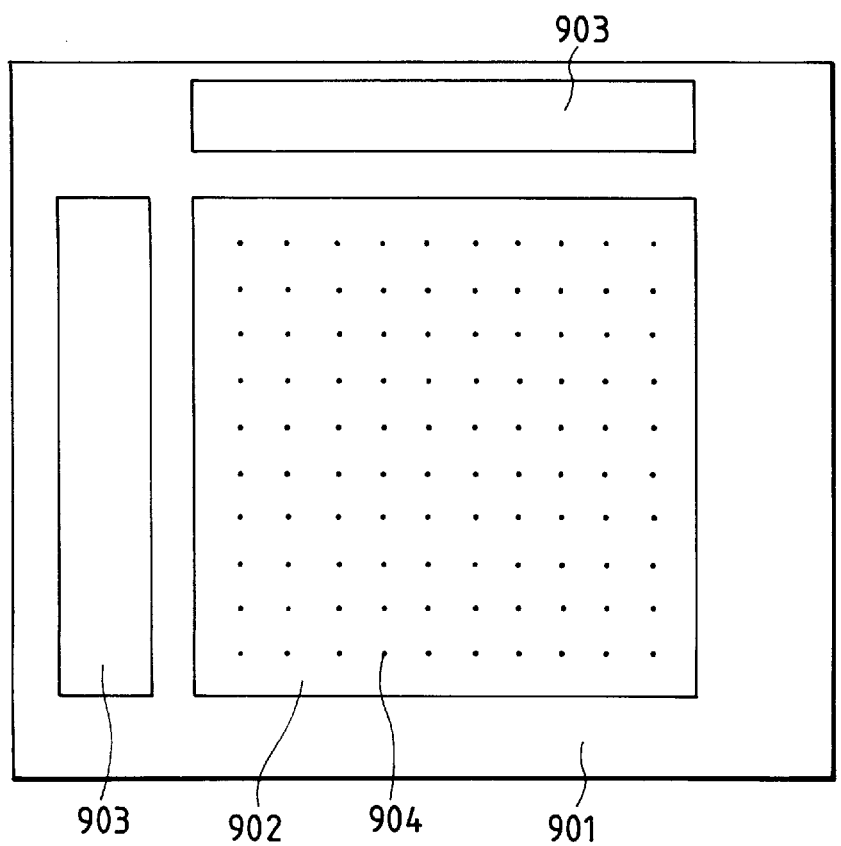
FIG. 41 is a view showing an embodiment 22 of the present invention.

According to the present invention, a photoelectric converter is disposed within a liquid crystal display unit. Hereby, a point on the display unit can be selected as an optical pointer of input means if using a normal light source or a laser beam made a spot by virtue of the lens. This embodiment is shown in FIG. 41. Reference numerals are identical to those of FIG. 35, wherein 901 is a substrate for supporting the liquid crystal display unit. A liquid crystal display 902 and a photodetector 904 are driven by a drive circuit 903. In this embodiment, photodetectors 904 are distributed within the liquid crystal display, The manufacturing of this structure is shown in FIGS. 42A to 42C. The basic process and method are equivalent to those of FIG. 37. On a transparent substrate 1401 is deposited an active layer 1403 made of a-Si or poly-Si, on which a gate oxide film 1404 and a gate electrode 1405 are deposited to form a pixel transistor, and then a metallic film is selectively made to form a drain electrode 1411 for the pixel transistor and a metallic wiring 1422 for the photodetector. An insulating film 1407 is formed thereon, and then a signal wiring 1408 and a gate wiring 1409 are formed and connected to a source and a gate of the pixel transistor, respectively. Further, an n-type a-Si 1423 and an a-SiGe 1424 are formed on the wiring 1422 of the photodetector in a similar way to the embodiment 20.

Further, a p-type a-Si is deposited on a-Si Ge 1425, and a transparent electrode 1427 is made to form a photodetector. The material for the transparent electrode is typically ITO. An insulating layer 1426 is vapor deposited thereon, and a transparent electrode is made to form a pixel electrode 1410. Also, it is possible to constitute the pixel electrode 1410 and the transparent electrode 1427 for the photodetector according to the same process. With this manufacturing method, the constitution of FIG. 42C can be realized. In this embodiment, the metallic wiring 1422 is spread over the entire area of light detection, in a similar way to the embodiment 20, and the light passing through the light detection area is reflected against the metallic wiring 1422 to again enter the light detection area, so that the detection efficiency can be further enhanced. On the other hand, the external light incident from the back side of the substrate can be prevented from entering the detection area, because it is shielded by the metallic wiring 1422 even if transmitted through the transparent substrate 1401.

By sandwiching a liquid crystal between the substrate above fabricated and an opposed substrate, a voltage can be applied to the liquid crystal in accordance with the drain output voltage of the transistor.

Also, a photodetector can be disposed within the liquid crystal display, and by sequentially detecting the output from the photodetector using a switching transistor fabricated simultaneously with the pixel transistor, it is possible to detect where the optical pointer points to within the liquid crystal display. It is needless to say that by attaching a light filter on the front face of the detector to permit the light having wavelength passing through this filter to be contained in this optical pointer, the malfunction due to the external light can be prevented.

[Embodiment 23]

Figure 43A:
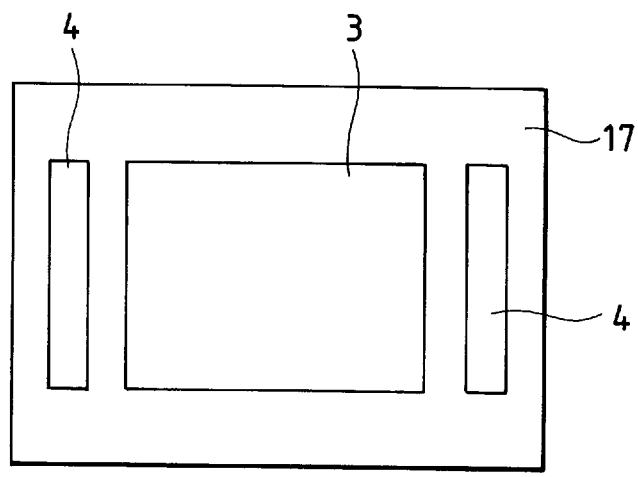
FIG. 43A is a typical plan view of a display unit having a photoelectric converter.
Figure 43B:
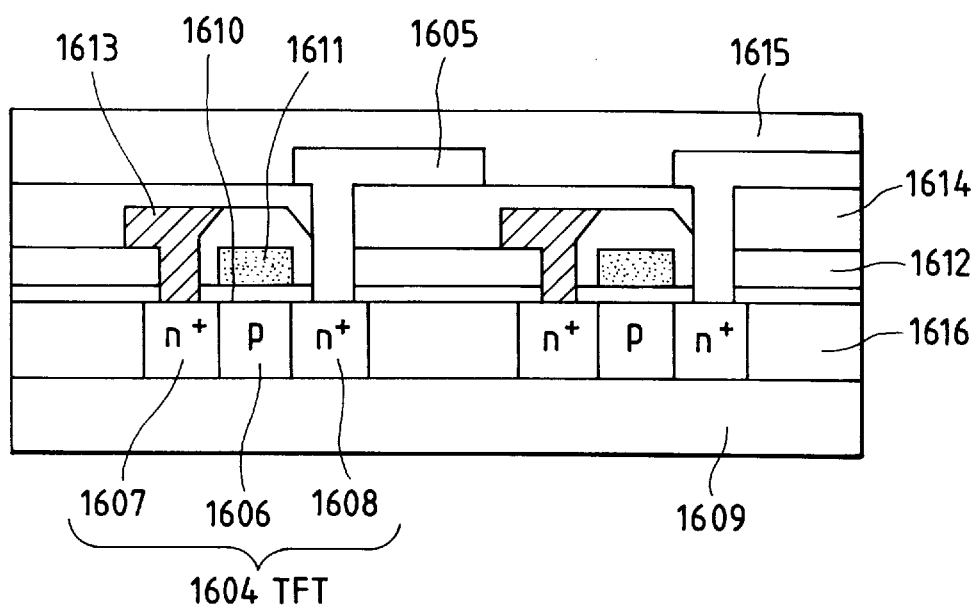
FIG. 43B is a typical cross-sectional view showing one embodiment.
Figure 44:
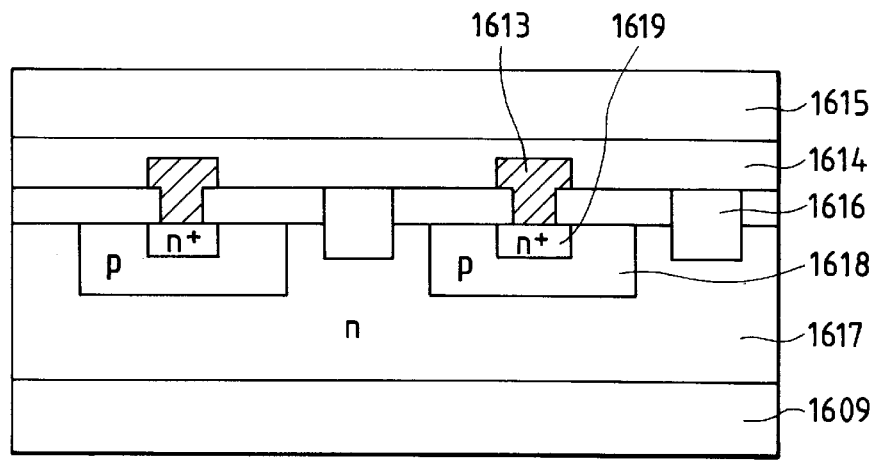
FIG. 44 is a typical cross-sectional view showing one embodiment of another display unit.

The structure of a liquid crystal display unit with a photoelectric conversion device mounted is shown in FIGS. 43A and 43B and FIG. 44. In the figure, 4 is a photoelectric converter, 3 is a liquid crystal display, 17 is a substrate, 1604 is a thin film transistor (hereinafter referred to as "TFT"), 1605 is a pixel electrode, 1606 is a TFT channel region, 1607 is a source diffusion layer, 1608 is a drain diffusion layer, 1609 is a substrate, 1610 is a gate insulating layer, 1611 is a gate electrode, 1612, 1614 to 1616 are insulating layers, 1613 is an electrode, 1617 is a collector, 1618 is a base and 1619 is an emitter.

FIG. 43A is a typical plan view of a liquid crystal display panel having a photoelectric converter. The liquid crystal display panel has the liquid crystal display 3 and the photoelectric converter 4 on the substrate 17 of one sheet composed of a transparent material such as a semiconductor or glass. As shown in FIGS. 43A and 43B, a pair of photoelectric converters are disposed on the left and right sides, but only one photoelectric converter or two pairs of photoelectric converters, including upper and lower converters, may be disposed, as required. Each photoelectric convert can have a line sensor of structure wherein a number of photoelectric conversion elements are arranged in a row, or an area sensor of structure where they are arranged in a two-dimensional array.

FIG. 43B is a cross-sectional view of a liquid crystal display, wherein on a semiconductor substrate with its surface insulated or a substrate 1609 made of a transparent insulating material such as glass are disposed a TFT 1604 having a channel region 1606 of thin film single crystal semiconductor, a pixel electrode 1605 made of a transparent conductive material such as ITO connected to a drain diffusion layer 1608 of TFT 1604, and a source electrode 1613 connected to a source diffusion layer 1607 of TFT 1604 to which image signal is input, and a gate electrode 1611 of TFT. The adjacent TFTs are separated by a thick insulating layer 161, the surface of TFT being insulated by using multiple insulating layers 1612, 1614 and 1615. Thus, a liquid crystal display panel is constructed by carrying a liquid crystal between the substrate as shown in this figure and a substrate (not shown) having an opposed electrode. Also, in order to enhance the gradation and image quality, another electrode grounded is provided under the pixel electrode 1605 to form a holding capacity between it and the pixel electrode 1605.

In the actual liquid crystal display unit, pixel TFTs 1604 are arranged in a two-dimensional array for connecting horizontally and vertically between gate electrodes 1611 and between source electrodes 1613. The wiring to which the gate electrode is connected is referred to as a scan line, which turns on/off the TFT channel at predetermined timings. Also, image signal is input to a signal line to which the source electrode is connected, and a predetermined image signal is written into the pixel electrode when TFT is turned on. The difference between the pixel voltage at this time and the voltage of the opposed electrode on the other substrate is applied to the liquid crystal. Liquid crystal has its light transmittance varied in accordance with the applied voltage, so that image information is displayed.

FIG. 44 is a cross-sectional view of the above photoelectric converter. On a semiconductor substrate with its surface insulated, or a substrate 1609 made of a transparent insulating material such as glass are disposed a collector 1617, a base 1618 and an emitter 1619 of a bipolar-type transistor, the emitter being pulled out from the electrode 1613 to provide a signal output. The adjacent photoelectric conversion elements are separated by a thick insulating layer 1616, the surface being insulated by multiple insulating layers 1612, 1614, and 1615. This type of photoelectric conversion element is referred to as BASIS (Base-Store Type Image Sensor), wherein holes produced by incident light are stored in the base 1618, and the electron current proportional to the number of holes is output due to amplification action of the bipolar transistor. The details of the operation principle for BASIS were described in, for example, IEEE Transactions on Electron Devices Vol. 36, No. 1, January 1989 pp. 31–38 "A Novel Bipolar Imaging Device with Self-Noise Reduction Capability" N. Tanaka, T. Ohmi, Y. Nakamura.

Thereby, the system can be made still smaller, like the above embodiments.

(Embodiment 24)

A liquid crystal display unit of the present invention has a constitution of liquid crystal display and an operation method of image which are equivalent to those of the liquid crystal display unit previously described. The arrangement of a photoelectric converter 4 and a display 3 of the liquid crystal display panel as shown in FIGS. 43A and 43B will be described below.

Figure 45:
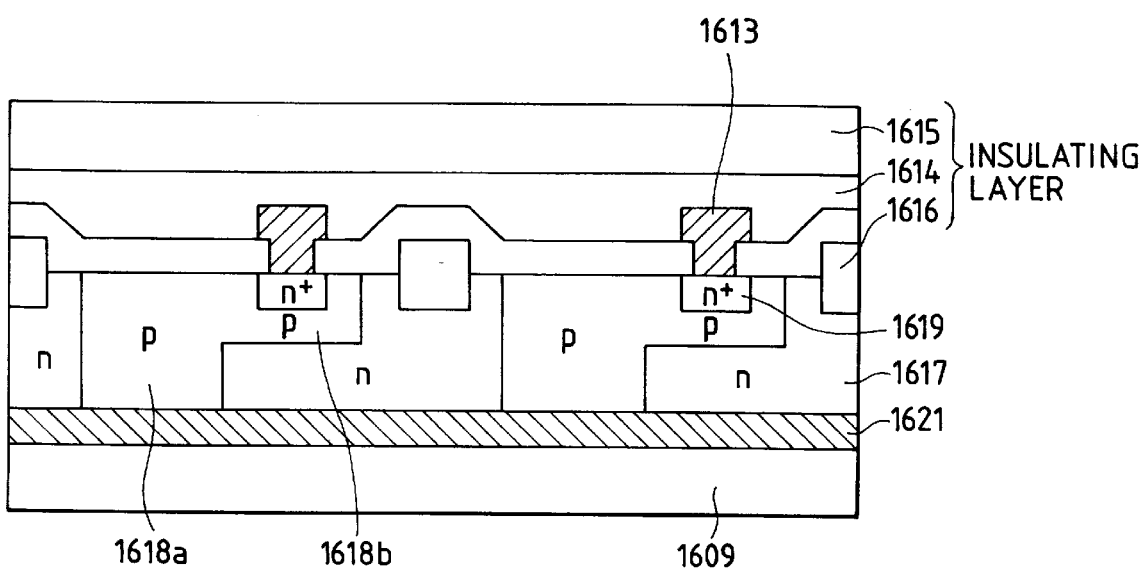
FIG. 45 is a cross-sectional view of a photoelectric converter in an embodiment of the present invention.

The cross section of the photoelectric converter in this embodiment is shown in FIG. 45. In the figure, 1609 is a substrate, 1612, 1614 to 1616 are insulating layers, 1613 is an electrode, 1617 is a collector, 1618a, 1618b is a base, 1619 is an emitter, and 1621 is a metallic layer. In this embodiment, on a semiconductor substrate with its surface insulated or a substrate 1609 made of a transparent insulating material is provided a metallic layer 1621 for forming a Schottky junction with silicone of the photoelectric converter. In this embodiment, Pt or PtSi was used. The base region of bipolar-type transistor consists of a deep base 1618a in contact with the metallic layer 1621 and a shallow base 1618b in contact with the deep base 1618a and not reaching the metallic layer 1621, having a concentration of impurities of $10^{16}$ to $10^{18}$ $cm^{-3}$. An n-type collector 1617 surrounds the base, and makes contact with the metallic layer 1621. Within the shallow base 1618b is provided an $n^+$-type emitter 1619 on the surface of silicone layer, to which an emitter electrode 1613 is connected. An insulating layer 1616 of $SiO_2$ is provided for the insulation between adjacent pixels, and the surface of silicone layer is sequentially covered and protected by an interlayer insulating layer 1612 of oxide silicone and interlayer insulating layers 1614, 1615 or SiN.

The photoelectric conversion principle of this embodiment is exactly the same as that of the previous embodiment. However, the following features are provided owing to the metallic layer 1621 and the deep base 1618a.

1. Since silicone layer is in contact with the metallic layer, the heat of photoelectric conversion unit is conducted through the metallic layer to the outside terminal, whereby temperature elevation is suppressed.

2. Infrared ray passing through the thickness of silicone layer having several microns is reflected against the metallic layer, thereby gaining additional chance of contributing again to the photoelectrically converted signal.

3. Owing to a depletion layer extending from the metallic layer to silicone, charges in the area near the substrate are collected more efficiently into the base region.

Figure 46A:
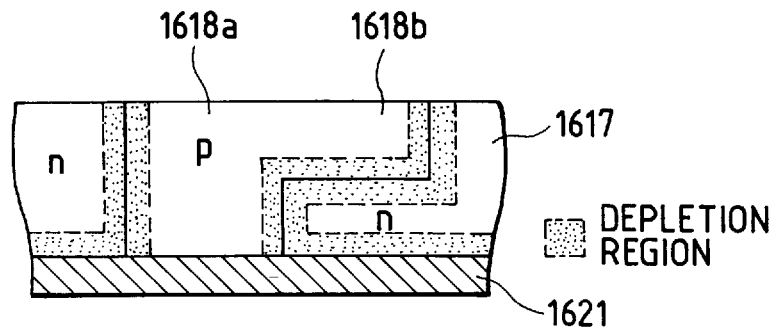
FIGS. 46A and 46B are explanation views of a depletion layer for a photoelectric converter according to the present invention.
Figure 46B:
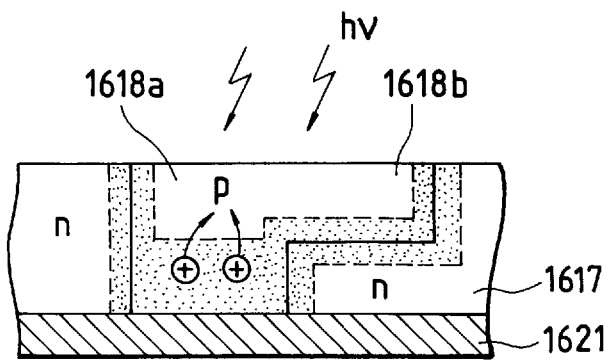

The above item 3 will be described below with reference to FIGS. 46A and 46B. FIG. 46A shows the spreading of depletion layer when the voltage of Pt is substantially equal to the voltage of base 1618a, and FIG. 46B shows the spreading of depletion layer when the voltage of Pt is substantially equal to the voltage of collector 1617. The spreading of depletion layer according to the present invention is shown in FIG. 46B, wherein the region of the deep base 1618a near the metallic layer 1621 is depleted by biasing Pt in a positive direction relative to the base region. Holes produced in this region are more likely to accumulate in the base region, owing to electric field in the depletion layer. In the conventional structure, carriers produced in this region partially diffused over adjacent elements, causing a degraded S/N ratio. In this embodiment, owing to more chances of producing pairs of electron and hole, the photoelectric conversion efficiency is enhanced.

Also, the stray light and the external light incident from the substrate side are totally reflected against the metallic layer 1621, without causing any noise.

A manufacturing process of the liquid crystal display unit according to the present invention will be described below.

Figure 47A:
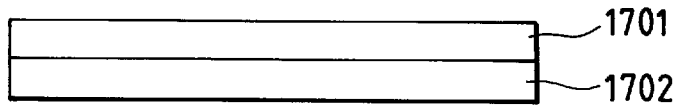
FIGS. 47A to 47E are fabrication process views of a photoelectric converter in an embodiment of the present invention.
Figure 47B:
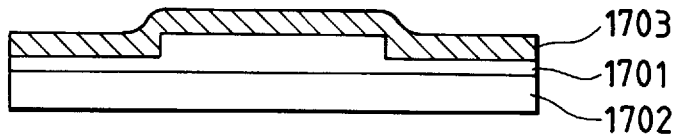
Figure 47C:
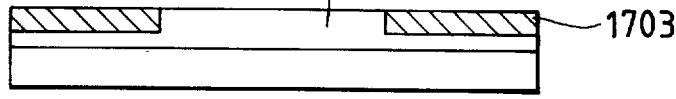
Figure 47D:
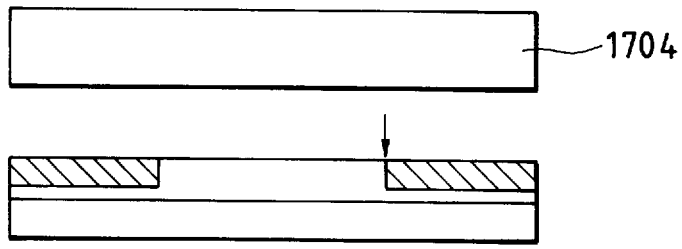
Figure 47E:
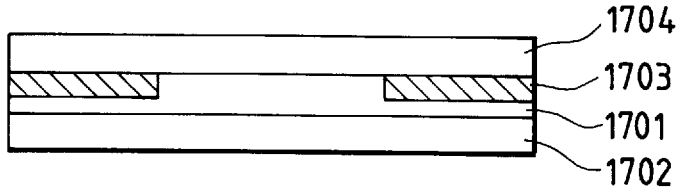

The manufacturing process of a first substrate having a metallic layer is shown in FIGS. 47A to 48E. First, a silicone substrate 1702 having oxide silicone 1701 formed by oxidizing the surface 5000 to 10000 Å thick is prepared (FIG. 47A). After removing the oxide film on the necessary area of a metallic layer 1703 about 3000 to 8000 Å thick, a metal such as Pt, Co and Al for forming a Schottky junction with n-type silicone is deposited about 1000 to 5000 Å thick by sputtering or CVD (FIG. 47B). Next, a metallic layer 1703 on thick oxide film 1701a is removed by polishing to make the surface flat (FIG. 47C). Oxide film serves as the stopper in polishing. Then, another sheet of silicone substrate 1704 is prepared, and bonded with a wafer which has been polished (FIG. 47D). After bonding, a heat treatment is conducted at a temperature not exceeding the fusing point of metallic layer 1703 to enhance the bonding strength. Finally, the silicone layer is made thinner to a desired thickness by polishing.

The subsequent process will be described below with reference to FIGS. 43A, 43B and 45. The display and the photoelectric converter may be thinned once and then grown to a thickness of 3 to 5 μm necessary for the photoelectric converter by epitaxial growth, or made to have an initial thickness of 3 to 5 μm and then thinned to a thickness of 3000 Å to 1 μm only on the display side, because of its different thickness of silicone layer.

In this embodiment, the silicone layer was made an n-type silicone of $1 \times 10^{13}$ to $1 \times 10^{15}$ $cm^{-3}$. On this silicone layer, a deep base region 1618a was initially formed by ion implantation and thermal diffusion. Then, a p-type layer (channel region 1606) and a shallow base layer 1618b on the display were formed by ion implantation and thermal diffusion. In this embodiment, the density of the p-type layer and the deep base layer on the display was $1 \times 10^{16}$ $cm^{-3}$ and the density of shallow base layer was $1 \times 10^{17}$ $cm^{-3}$, but they can be made in the range of about $1 \times 10^{15}$ to $1 \times 10^{17}$ $cm^{-3}$ and the range of about $1 \times 10^{16}$ to $1 \times 10^{18}$ $cm^{-3}$, respectively, according to the purpose.

Next, an insulating film 1616 for the separation is formed by LOCOS. The thickness was 1000 Å. Then, a source diffusion layer 1607, a drain diffusion layer 1608, an $n^+$ region and an emitter 1619 were formed by ion implantation and heat treatment. Implanted dopant was $Ph^+$, with the amount of implantation of $5 \times 10^{15}$ $cm^{-2}$, but it is possible that the dopant may be $As^+$ with the amount of implantation of about $1 \times 10^{15}$ to $1 \times 10^{16}$ $cm^{-2}$. In the cross-sectional view, the $n^+$ layer of source and drain has reached the substrate 1609, but is not necessary to reach it.

On the preformed gate oxide film having a thickness of 200 to 1000 Å is formed a polysilicone electrode. Implantation of ions into the source and drain is normally made through polysilicone gate self-aligned. After depositing a BPSG film (insulating film 1612) about 7000 Å thick by CVD, a contact hole is formed, and an aluminum electrode 1613 is deposited and patterned.

Thereafter, a first interlayer insulating layer 1614 is deposited, and a transparent pixel electrode 1605 is formed on the display. A pixel electrode 1605 is formed in direct contact with a drain 1608 and using ITO (Indium Tin Oxide). Finally, a silicone nitride film (insulating layer 1615) is formed as the passivation film.

Figure 48:
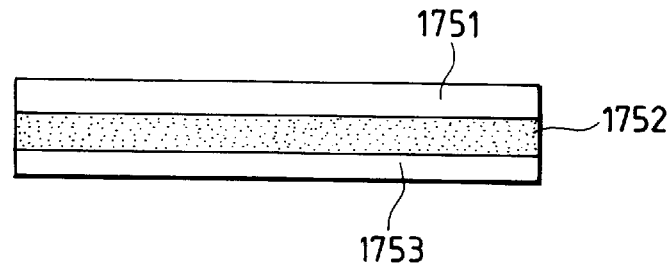
FIG. 48 is a typical cross-sectional view for explaining another fabrication process of a photoelectric converter in an embodiment of the present invention.

Among other manufacturing methods of the first substrate (TFT substrate), there is an ELTRAN (Epitaxial Layer Transfer on Porous Silicon). With this method, instead of the second silicone wafer in FIG. 47D, a substrate (FIG. 48)

having an epitaxial layer formed on a silicone wafer, the surface of which is made porous 5 to 50 μm thick, is used. This wafer is an SOI substrate having an epitaxial layer with even film thickness and good quality, which is obtained by etching the silicone substrate 1751 and porous silicone 1752 in a mixture silicon of HF and $H_2O_2$ after bonding the epitaxial layer 1753. The manufacturing of TFT and photoelectric converter is exactly the same as that of the first substrate.

The TFT structure may be composed of polysilicone as the channel, single crystal in which polysilicone is recrystallized, or amorphous silicone as the channel, to the exactly same effect.

Further, the p-type MOS transistor or pnp-type bipolar transistor can be used by changing the voltage slightly without spoiling the effect of the present invention.
(Embodiment 25)

FIG. 48 shows the cross section of a photoelectric converter according to the twenty-fifth embodiment of the present invention. This embodiment has a structure where a deep base formed in the embodiment 24 is omitted. In this embodiment, the crosstalk occurs as before since there is no spread of the depletion layer of metal over the base region, but the heat radiation effect, reflection effect of infrared ray, and light shielding effect against visible light from the back side can be obtained equivalently to those of the embodiment 1. Also, there is provided the advantage that the process of forming a thin base is unnecessary, and the transistor structure may be the same as conventionally used.
(Embodiment 26)

Figure 49:
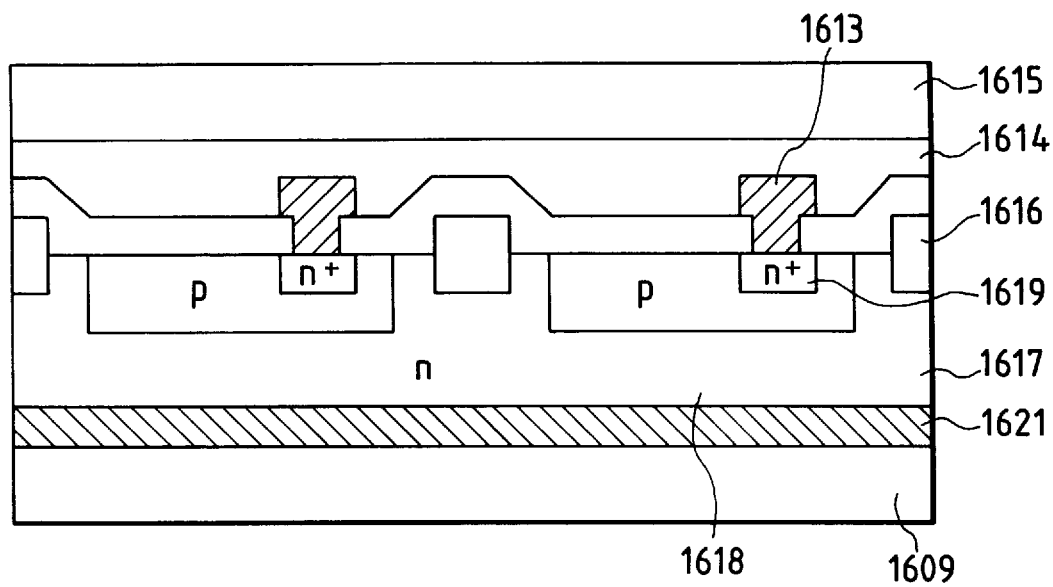
FIG. 49 is a cross-sectional view of a photoelectric converter in an embodiment 25 of the present invention.
Figure 50:
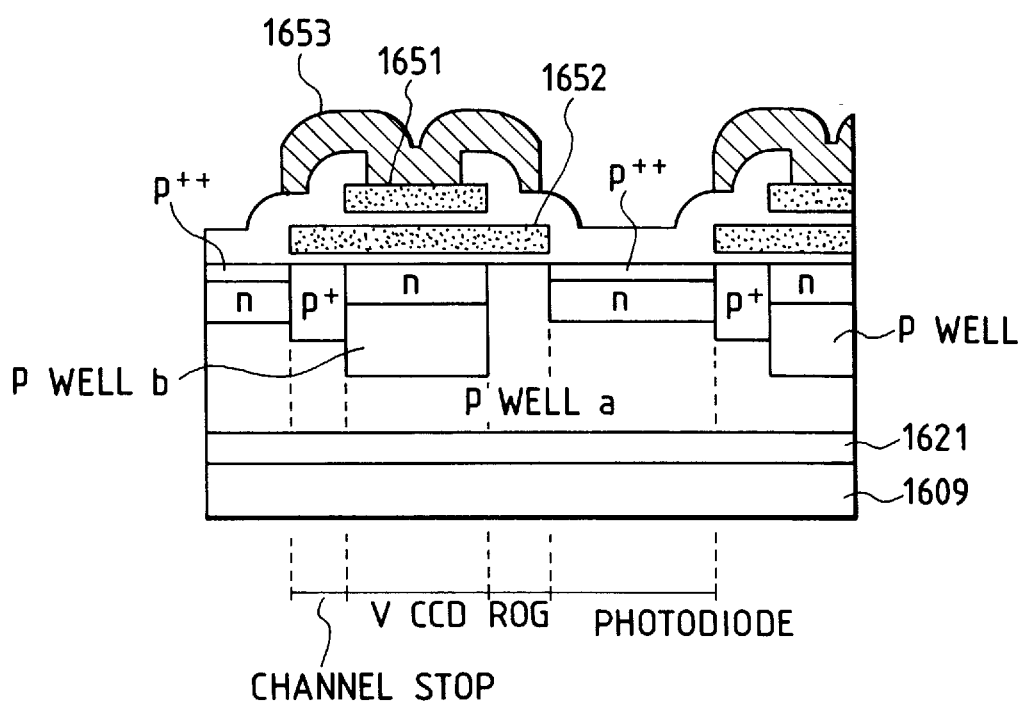
FIG. 50 is a cross-sectional view of a photoelectric converter in an embodiment 26 of the present invention.

FIG. 50 is a cross section of a photoelectric converter according to the twenty-sixth embodiment of the present invention. This embodiment has a photoelectric converter composed of a CCD (Charge Coupled Device). The basic constitution of this CCD and its operation was described in M. Yamagishi et al. IEEE Trans, Electron Devices, Ed-38, pp. 976 (1991). In this figure, 1651 is a polysilicone gate, 1652 is a transfer gate and 1653 is an aluminum wiring. In this embodiment, a negative bias is applied to the p-well a to prevent the spreading of the depletion layer, in FIG. 49. In the case of CCD, infrared ray transmitted through silicone can be reflected against the metallic film, and again subjected to photoelectric conversion.

Also, an ideal light shielding film can be obtained for the visible light incident from the back side. Further, heat generation of CCD is 10 to 100 times greater than the BASIS-type photoelectric conversion unit, but this heat could be released via the metallic film to the outside. In this embodiment, the photoelectric conversion unit had a better S/N ratio, and the stable output voltage.

As described above, according to the present invention, there are provided a plurality of light receiving means for receiving reflected light from the eye ball, with the illuminating means illuminating the eye ball of the object (observer), and calculation means for calculating the sight line direction of the object (observer) based on the output signal from said plurality of light receiving means, wherein the original output of Purkinje image and this pseudo peak output are separated by, for example, taking a logical product of output signals from said plurality of light receiving means, so that the sight line direction of the object (observer) can be calculated from obtained Purkinje image.

Hence, the proper sight line detection can be always effected even under service environment where other light than illuminating light from illuminating means is incident.

According to the present invention, a liquid crystal display unit is provided with a photoelectric converter excellent in the photoelectric conversion efficiency, so that the display facility and the sight line detection facility can be accommodated with good space efficiency.

Also, since the focusing for the display can be made in accordance with the sight line in using a view finder, the observer hardly feels fatigued in the use for the long time.

Further, with the electronic camera such as a video camera using a view finder of the present invention, the focusing can be surely effected for the portion to be photographed, resulting in the extremely excellent recording.

Also, the liquid crystal display unit of the present invention, having a photoelectric converter integrally formed, can be constructed in smaller size, so that the view finder as well as the electronic camera can be made compact and equipped with higher functions.

The photoelectric conversion element for the sight line detection according to the present invention was described, but it is of course possible that the photoelectric conversion element can be used for the measurement of the brightness around the liquid crystal display unit or the brightness of light source of backlight. In this case, it is not necessarily required to provide a plurality of photoelectric conversion elements, but it only suffices that at least one photoelectric conversion element is provided on the necessary portion.

Further, according to the present invention, the image display unit having a sight line detection function such as a view finder is unnecessary to have any new, independent photoelectric conversion means and its drive means, giving rise to the effects of greatly simplified system and the reduced costs.

In addition, by appropriately selecting the semiconductor material for the photoelectric converter, a light detection mechanism having high quantum efficiency can be constructed on-chip on the thin film semiconductor substrate. Thereby, the electronic view finder with a sight line detector can be manufactured cheaply. Also, a photodetector can be provided within the liquid crystal display, and thus the display unit is enabled to make the input by pointing to any position within the display using an optical pointer.

The liquid crystal display unit of the present invention has the effects:

1. Heat generated by the photoelectric converter can be released to prevent the dark current from increasing with the elevated temperature.

2. By causing infrared ray to be reflected and incident on the silicone layer again, the photoelectric conversion efficiency can be enhanced.

3. Convergence of carriers into the base region is promoted to prevent the crosstalk.

4. Metallic layer can be also used for the ideal light shielding film for the visible light, which may be the external light or stray light entering from the back side.

And according to the present invention, a photoelectric conversion unit is formed on the thin film, and easily exposed to relatively high temperatures by the backlight, whereby even the liquid crystal display unit including a sight line detection function which may require a high detection sensitivity to light having relatively long wavelength such as infrared ray, can be used stably without degrading the above sight line detection function.

It will be understood that various variations of the present invention may be appropriately made within the spirit or scope of the present invention.

What is claimed is:

1. A liquid crystal display unit for a view finder having a sight line detecting function comprising:

a pair of substrates;

a liquid crystal material sealed between said pair of substrates;

semiconductor elements provided at either substrate, for driving said liquid crystal display unit; and photoelectric conversion elements provided at either substrate, for detecting the sight line.

2. A display unit according to claim 1, wherein one of said pair of substrates has; a plurality of signal lines and a plurality of scan lines arranged in a matrix, said semiconductor elements being provided at points of intersection between said signal lines and said scan lines, pixel electrodes electrically connected to said semiconductor elements, and said photoelectric conversion elements, and wherein the other of said pair of substrates comprises electrodes corresponding to said pixel electrodes.

3. A display unit according to claim 1, wherein said photoelectric conversion elements are provided in a first semiconductor region and said semiconductor elements are provided in a second semiconductor region.

4. A display unit according to claim 3, wherein said first semiconductor region and said second semiconductor region are formed on the same semiconductor substrate.

5. A display unit according to claim 3, wherein the thickness of semiconductor of said first semiconductor region is greater than that of semiconductor of said second semiconductor region.

6. A display unit according to any one of claims 1 to 5, further comprising a circuit for driving said semiconductor elements.

7. A display unit according to claim 6, wherein said circuit is a shift register.

8. A display unit according to claim 6, wherein said circuit is provided on a semiconductor substrate having said semiconductor elements provided thereon.

9. A display unit according to claim 1, wherein said semiconductor elements are thin film transistors.

10. A display unit according to claim 3, wherein said first semiconductor region is silicon single crystal or amorphous silicon, and said second semiconductor region is polysilicon or amorphous silicon.

11. A display unit according to claim 3, wherein said first and second semiconductor regions are composed of single crystal silicon, and an insulating layer is provided directly under each of said semiconductor regions.

12. A display unit according to claim 2, wherein said one substrate comprises a first semiconductor substrate or a quartz substrate having an insulating film on the surface and a second semiconductor substrate.

13. A display unit according to claim 3, wherein an insulating layer formed by ion implantation of oxygen is provided directly under semiconductors of said first semiconductor region.

14. A display unit according to claim 3, wherein an insulating layer formed by selective oxidation of substrate surface is provided directly under semiconductors of said first semiconductor region.

15. A display unit according to claim 1, wherein a reflection film for reflecting light is formed on a back face of a side where detection light is incident on said photoelectric conversion elements.

16. A display unit according to claim 1, wherein a metallic layer overlying at least partly on said photoelectric conversion elements is provided between one of said substrates and said photoelectric conversion elements, and a semiconductor layer of said photoelectric conversion elements and said metallic layer form a Schottky junction.

17. A display unit according to claim 16, wherein each said photoelectric conversion element is a base store-type image sensor.

18. A display unit according to claim 17, wherein each said photoelectric conversion element has first and second base regions having different depths, and a deeper base region is in contact with the metallic layer.

19. A display unit according to claim 1 or 2, wherein each said photoelectric conversion element is a charge coupled device.

20. A display unit according to claim 1 or 2, wherein each said photoelectric conversion element has amorphous silicon semiconductor.

21. A view finder with a sight line detecting function comprising:

a liquid crystal display unit having a pair of substrates, a liquid crystal material sealed between said pair of substrates, semiconductor elements provided at either substrate for driving said liquid crystal display unit, and photoelectric conversion elements provided at either substrate for detecting the sight line; and an eyepiece provided opposite said liquid crystal display unit.

22. A view finder according to claim 21, wherein one of said pair of substrates has a plurality of signal lines and a plurality of scan lines arranged in a matrix, said semiconductor elements being provided at points of intersection between said signal lines and said scan lines, pixel electrodes electrically connected to said semiconductor elements, and said photoelectric conversion elements, and wherein the other of said pair of substrates comprises electrodes corresponding to said pixel electrodes.

23. A view finder according to claim 21, wherein said photoelectric conversion elements are provided in a first semiconductor region and said semiconductor elements are provided in a second semiconductor region.

24. A view finder according to claim 23, wherein said first semiconductor region and said second semiconductor region are formed on the same semiconductor substrate.

25. A view finder according to claim 23, wherein the thickness of semiconductor of said first semiconductor region is greater than that of semiconductor of said second semiconductor region.

26. A view finder according to claim 21, further comprising a circuit for driving said semiconductor elements.

27. A view finder according to claim 26, wherein said circuit is a shift register.

28. A view finder according to claim 26, wherein said circuit is provided on a semiconductor substrate having said semiconductor elements provided thereon.

29. A view finder according to any one of claims 21 to 23, wherein said semiconductor elements are thin film transistors.

30. A view finder according to claim 23, wherein said first semiconductor region is silicon single crystal or amorphous silicon, and said second semiconductor region is polysilicon or amorphous silicon.

31. A view finder according to claim 23, wherein said first and second semiconductor regions are composed of single crystal silicon, and an insulating layer is provided directly under said second semiconductor region.

32. A view finder according to claim 22, wherein said one substrate comprises a first semiconductor substrate or a quartz substrate having an insulating film on the surface and a second semiconductor substrate.

33. A view finder according to claim 23, wherein an insulating layer formed by ion implantation of oxygen is provided directly under semiconductors of said first semiconductor region.

34. A view finder according to claim 23, wherein an insulating layer formed by selective oxidation of substrate surface is provided directly under semiconductors of said first semiconductor region.

35. A view finder according to claim 21, further comprising an optical system for making light incident upon said photoelectric conversion elements, apart from said eyepiece.

36. A view finder according to claim 35, further comprising a light emitting source of said light.

37. A view finder according to claim 21, wherein a reflection film for reflecting light is formed on a back face of a side where detection light is incident in said photoelectric conversion elements.

38. A view finder according to claim 21, wherein a metallic layer overlying at least partly on said photoelectric conversion elements is provided between one of said substrates and said photoelectric conversion elements, and a semiconductor layer of said photoelectric conversion elements and said metallic layer form a Schottky junction.

39. A view finder according to claim 38, wherein each said photoelectric conversion element is a base store-type image sensor.

40. A view finder according to claim 39, wherein each said photoelectric conversion element has first and second base regions having different depths, and a deeper base region is in contact with the metallic layer.

41. A view finder according to claim 21, wherein each said photoelectric conversion element is a charge coupled device.

42. A view finder according to claim 21, wherein each said photoelectric conversion element has amorphous silicon semiconductor.

43. A camera with a sight line detecting function comprising:
   a view finder having a liquid crystal display unit, and an eyepiece provided opposite said liquid crystal display unit, said liquid crystal display unit comprising a pair of substrates, a liquid crystal material sealed between said pair of substrates, semiconductor elements provided at either substrate for driving said liquid crystal display unit, and photoelectric conversion elements provided at either substrate for detecting a sight line; and
   an image pick-up element for reading an image to be displayed by said liquid crystal display unit.

44. A camera according to claim 43, wherein one of said pair of substrates has a plurality of signal lines and a plurality of scan lines arranged in a matrix, said semiconductor elements being provided at points of intersection between said signal lines and said scan lines, pixel electrodes electrically connected to said semiconductor elements, and said photoelectric conversion elements, and wherein the other of said pair of substrates comprises electrodes provided corresponding to said pixel electrodes.

45. A camera according to claim 43, wherein said photoelectric conversion elements are provided in a first semiconductor region and said semiconductor elements are provided in a second semiconductor region.

46. A camera according to claim 45, wherein said first semiconductor region and said second semiconductor region are formed on the same semiconductor substrate.

47. A camera according to claim 45, wherein the thickness of semiconductor of said first semiconductor region is greater than that of semiconductor of said second semiconductor region.

48. A camera according to claim 43, further comprising a circuit for driving said semiconductor elements.

49. A camera according to claim 48, wherein said circuit is a shift register.

50. A camera according to claim 48, wherein said circuit is provided on a semiconductor substrate having said semiconductor elements provided thereon.

51. A camera according to claim 43, wherein said semiconductor elements are thin film transistors.

52. A camera according to claim 45, wherein said first semiconductor region is silicon single crystal or amorphous silicon, and said second semiconductor region is polysilicon or amorphous silicon.

53. A camera according to claim 45, wherein said first and second semiconductor regions are composed of single crystal silicon, and an insulating layer is provided directly under said second semiconductor region.

54. A camera according to claim 44, wherein said one substrate comprises a first semiconductor substrate or a quartz substrate having an insulating film on the surface -and a second semiconductor substrate.

55. A camera according to claim 45, wherein an insulating layer formed by ion implantation of oxygen is provided directly under semiconductors of said first semiconductor region.

56. A camera according to claim 45, wherein an insulating layer formed by selective oxidation of substrate surface is provided directly under semiconductors of said first semiconductor region.

57. A camera according to claim 43, wherein said view finder further comprises an optical system for making light incident upon said photoelectric conversion elements, apart from said eyepiece.

58. A camera according to claim 57, wherein said view finder further comprises a light source of said light.

59. A camera according to claim 57, wherein said light is light reflected from an observer's eye.

60. A camera according to claim 43, further comprising an optical system for imaging information input into said image pickup elements onto said image pickup elements, wherein the focusing of said optical system is made by optical information input into said photoelectric conversion elements.

61. A camera according to claim 43, wherein light received by said photoelectric conversion elements contains information for determining the sight line direction of an eye of an observer observing said display unit, and wherein the camera further comprises means for measuring the sight line direction with an electric signal output by said photoelectric conversion elements.

62. A camera according to claim 43, wherein a reflection film for reflecting light is formed on a back face of a side where detection light is incident in said photoelectric conversion elements.

63. A camera according to claim 43, wherein a metallic layer overlying, at least partly on said photoelectric conversion elements is provided between one of said substrates and said photoelectric conversion elements, and a semiconductor layer of said photoelectric conversion elements and said-metallic layer form a Schottky junction.

64. A camera according to claim 63, wherein each said photoelectric conversion element is a base store-type image sensor.

65. A camera according to claim 64, wherein each said photoelectric conversion element has first and second base regions having different depths, and a deeper base region is in contact with the metallic layer.

66. A camera according to claim 43, wherein each said photoelectric conversion element is a charge coupled device.

67. A camera according to claim 43, wherein each said photoelectric conversion element has amorphous silicon semiconductor.

68. A sight line detector comprising:
   illuminating means for illuminating an eyeball of an observer;

plural image sensors for receiving light reflected from the eyeball illuminated by said illuminating means, and for outputting an image signal corresponding respectively to an image of the eyeball; and calculating means for arithmetically processing the image signal outputted from each of said image sensors, to detect a direction of the sight line of the observer, wherein said calculating means compares with one another the image signals outputted from each of said image sensors to detect a false signal outputted only from one of said image sensors and to remove the false signal from the image signals, thereby calculating the direction of the sight line of the observer.

69. A sight line detector according to claim 68, wherein said calculating means calculates using a Purkinje image obtained by making a logical operation of peak positions of respective output signals from said plurality of image sensors.

70. A view finder with a sight line detecting function comprising:

an image display unit for monitoring an object;

illuminating means for illuminating an eyeball of an observer observing the object through said image display unit;

photoelectric conversion means arranged adjacent to said image display unit, for detecting light reflected from the eyeball illuminated by said illuminating means;

driving means for driving said image display unit, at least a part of said driving means driving said photoelectric conversion means; and calculating means for calculating a direction of the sight line of the observer based on an output from said photoelectric conversion means, wherein said image display unit comprises a liquid crystal display, and said photoelectric conversion means is disposed around the periphery of said image display.

71. A view finder according to claim 70, wherein said image display unit and said photoelectric conversion means are formed on a same substrate.

72. A view finder having a function of detecting a sight line of an observer, comprising:

an image display unit for monitoring an object;

illuminating means for illuminating an eyeball of the observer monitoring the object through said image display unit;

plural image sensors for receiving light reflected from the eyeball illuminated by said illuminating means, and for outputting an image signal corresponding respectively to an image of the eyeball; and calculating means for arithmetically processing the image signal outputted from each of said image sensors, so that an adverse effect due to externally incident light is removed, and a direction of the sight line of the observer is calculated, wherein said calculating means compares with one another the image signals outputted from each of said image sensors to detect a false signal outputted only from one of said image sensors and to remove the false signal from the image signals, thereby calculating the direction of the sight line of the observer.

73. A view finder according to claim 79, wherein said calculating means calculates the sight line direction of the object or observer using a Purkinje image obtained by making a logical operation of peak positions of respective output signals from said plurality of image sensors.

* * * * *

UNITED STATES PATENT AND TRADEMARK OFFICE
CERTIFICATE OF CORRECTION

PATENT NO. : 5,873,003

DATED : February 16, 1999

INVENTOR(S) : SHUNSUKE INOUE ET AL.

It is certified that error appears in the above-identified patent and that said Letters Patent is hereby corrected as shown below:

COLUMN 1

Line 34, "videocam coder" should read
         --video camcorder--.

COLUMN 3

Line 47, "polysilicone," should read --polysilicon,--;
  Line 48, "silicone," (both occurrences) should read
         --silicon,--;
  Line 52, "polysilicone" should read --polysilicon--;and
         "silicone," should read --silicon,--; and
  Line 53, "silicone," should read --silicon,--.

COLUMN 9

Line 32, "view" should read -- a view-; and
  Line 50, "constitute" should read --constituted--.

COLUMN 10

Line 17, "unit" should read -unit,-.

COLUMN 12

Line 53, "silicone" should read --silicon--; and
  Line 54, "polysilicone" should read --polysilicon--.

UNITED STATES PATENT AND TRADEMARK OFFICE
CERTIFICATE OF CORRECTION

PATENT NO. : 5,873,003

DATED : February 16, 1999

INVENTOR(S) : SHUNSUKE INOUE ET AL.

It is certified that error appears in the above-identified patent and that said Letters Patent is hereby corrected as shown below:

COLUMN 13

Line 11, "ammoniumhydroxide" should read --ammonium-hydroxide--;
Line 37, "silicone" should read --silicon--;
Line 43, "in" should be deleted;
Line 44, "compact." should read --compactly.--;
Line 56, "polysilicone" should read --polysilicon--; and
Line 64, "silicone" should read --silicon--.

COLUMN 14

Line 11, "ions.," should read --ions,--;

Line 17, "polysilicone" should read --polysilicon--;
Line 28, "silicone," should read --silicon,--;
Line 32, "polysilicone" should read --polysilicon--;
Line 50, "polysilicone" should read --polysilicon--;
Line 54, "silicone," should read --silicon,--;
Line 59, "silicone" (both occurrences) should read --silicon--; and
Line 62, "silicone" should read --silicon--.

COLUMN 15

Line 5, "silicone" should read --silicon--;
Line 6, "silicone" should read --silicon--;
Line 8, "silicone" should read --silicon--;
Line 9, "silicone" should read --silicon--;
Line 11, "silicone" (both occurrences) should read --silicon--;

UNITED STATES PATENT AND TRADEMARK OFFICE
CERTIFICATE OF CORRECTION

PATENT NO. : 5,873,003

DATED : February 16, 1999

INVENTOR(S) : SHUNSUKE INOUE ET AL.

It is certified that error appears in the above-identified patent and that said Letters Patent is hereby corrected as shown below:

COLUMN 15 (Contd.)

Line 13, "silicone" (both occurrences) should read --silicon--;
   Line 16, "silicone" should read --silicon--;
   Line 17, "silicone" should read --silicon--;
   Line 28, "silicone" should read --silicon--; and
   Line 41, "polysilicone" should read --polysilicon--.

COLUMN 18

Line 40, "is" should read --in--.

COLUMN 19

Line 55, "*semiconductor" should --semiconductor--.

COLUMN 21

Line 38, "witching" should read --wiching--; and
   Line 63, "a-Sige" should read --a-SiGe--.

COLUMN 22

Line 37, "observe" should read --observer--.

UNITED STATES PATENT AND TRADEMARK OFFICE
CERTIFICATE OF CORRECTION

PATENT NO. : 5,873,003

DATED : February 16, 1999

INVENTOR(S): SHUNSUKE INOUE ET AL.

It is certified that error appears in the above-identified patent and that said Letters Patent is hereby corrected as shown below:

COLUMN 25

Line 18, "silicone" should read --silicon--;
Line 26, "silicone" should read --silicon--;
Line 31, "silicone" should read --silicon--;
Line 37, "silicone" should read --silicon--;
Line 41, "silicone" should read --silicon--; and
Line 46, "silicone," should read --silicon,--.

COLUMN 26

Line 4, "silicone" should read --silicon--;
Line 19, "silicone" should read --silicon--.
Line 29, "silicone" should read --silicon--;
Line 30, "silicone" should read --silicon--; (both occurences)
Line 54, "polysilicone" should read --polysilicon--;
Line 62, "silicone" should read --silicon--; and
Line 67, "silicone" should read --silicon--.

UNITED STATES PATENT AND TRADEMARK OFFICE
CERTIFICATE OF CORRECTION

PATENT NO. : 5,873,003

DATED : February 16, 1999

INVENTOR(S) : SHUNSUKE INOUE ET AL.

It is certified that error appears in the above-identified patent and that said Letters Patent is hereby corrected as shown below:

COLUMN 27

Line 1, "silicone" should read --silicon--;
Line 5, "silicone" (both occurrences) should read --silicon--;
Line 6, "silicon" should be deleted;
Line 10, "polysilicone" should read --polysilicon--;
Line 11, "polysilicone" should read --polysilicon--; and
Line 12, "silicone" should read --silicon--.

COLUMN 29

Line 8, "has;" should read --has:--; and
Line 60, "overlying" should read --overlaying--.

COLUMN 32

Line 12, "surface-and" should read --surface and--; and
Line 48, "overlying," should read --overlaying--.

UNITED STATES PATENT AND TRADEMARK OFFICE
CERTIFICATE OF CORRECTION

PATENT NO. : 5,873,003

DATED : February 16, 1999

INVENTOR(S) : SHUNSUKE INOUE ET AL.

It is certified that error appears in the above-identified patent and that said Letters Patent is hereby corrected as shown below:

<u>COLUMN 34</u>

Line 28, "claim 79," should read --claim 72,--.

Signed and Sealed this

Twenty-fifth Day of April, 2000

*Attest:*

Q. TODD DICKINSON

*Attesting Officer*  *Director of Patents and Trademarks*